United States Patent
Ting et al.

(10) Patent No.: US 9,799,785 B1
(45) Date of Patent: Oct. 24, 2017

(54) UNIPOLAR BARRIER DUAL-BAND INFRARED DETECTORS

(71) Applicant: California Institute of Technology, Pasadena, CA (US)

(72) Inventors: David Z. Ting, Arcadia, CA (US); Alexander Soibel, South Pasadena, CA (US); Arezou Khoshakhlagh, Pasadena, CA (US); Sarath Gunapala, Stevenson Ranch, CA (US)

(73) Assignee: California Institute of Technology, Pasadena, CA (US)

(*) Notice: Subject to any disclaimer, the term of this patent is extended or adjusted under 35 U.S.C. 154(b) by 6 days.

(21) Appl. No.: 14/998,990

(22) Filed: Mar. 14, 2016

Related U.S. Application Data

(60) Provisional application No. 62/132,936, filed on Mar. 13, 2015.

(51) Int. Cl.
*H01L 31/02* (2006.01)
*H01L 31/0352* (2006.01)
(Continued)

(52) U.S. Cl.
CPC ........... *H01L 31/035236* (2013.01); *H01L 31/03046* (2013.01); *H01L 31/109* (2013.01); *H01L 31/1844* (2013.01)

(58) Field of Classification Search
CPC ........... H01L 31/101; H01L 31/03046; H01L 31/035236; H01L 31/0304; H01L 31/109; Y02E 10/544; B82Y 20/00
(Continued)

(56) References Cited

U.S. PATENT DOCUMENTS

| | | |
|---|---|---|
| 4,679,063 A | 7/1987 | White |
| 6,226,152 B1 | 5/2001 | Tanaka et al. |

(Continued)

FOREIGN PATENT DOCUMENTS

| | | |
|---|---|---|
| WO | 2005004243 A1 | 1/2005 |
| WO | 2008061141 A1 | 5/2008 |

OTHER PUBLICATIONS

Arias et al., "HgCdTe dual-band infrared photodiodes grown by molecular beam epitaxy", J. Appl. Phys, Oct. 15, 1991, 70(8), pp. 4620-4622.
(Continued)

*Primary Examiner* — Jonathan Han
(74) *Attorney, Agent, or Firm* — KPPB LLP

(57) ABSTRACT

Dual-band barrier infrared detectors having structures configured to reduce spectral crosstalk between spectral bands and/or enhance quantum efficiency, and methods of their manufacture are provided. In particular, dual-band device structures are provided for constructing high-performance barrier infrared detectors having reduced crosstalk and/or enhance quantum efficiency using novel multi-segmented absorber regions. The novel absorber regions may comprise both p-type and n-type absorber sections. Utilizing such multi-segmented absorbers it is possible to construct any suitable barrier infrared detector having reduced crosstalk, including npBPN, nBPN, pBPN, npBN, npBP, pBN and nBP structures. The pBPN and pBN detector structures have high quantum efficiency and suppresses dark current, but has a smaller etch depth than conventional detectors and does not require a thick bottom contact layer.

17 Claims, 18 Drawing Sheets

(51) Int. Cl.
*H01L 31/18* (2006.01)
*H01L 31/109* (2006.01)
*H01L 31/0304* (2006.01)

(58) Field of Classification Search
USPC ....... 257/E31.033, 184, 21, E31.067; 438/94
See application file for complete search history.

(56) References Cited

U.S. PATENT DOCUMENTS

| | | | |
|---|---|---|---|
| 6,433,354 | B1 | 8/2002 | Kuan et al. |
| 6,455,908 | B1* | 9/2002 | Johnson ................. B82Y 20/00 257/184 |
| 7,442,599 | B2 | 10/2008 | Maa et al. |
| 7,633,083 | B2 | 12/2009 | Lester et al. |
| 7,687,871 | B2 | 3/2010 | Maimon |
| 7,795,640 | B2 | 9/2010 | Klipstein |
| 7,928,473 | B2 | 4/2011 | Klipstein |
| 8,022,390 | B1 | 9/2011 | Kim et al. |
| 8,217,480 | B2 | 7/2012 | Ting et al. |
| 8,410,523 | B2 | 4/2013 | Huffaker et al. |
| 8,928,029 | B2 | 1/2015 | Ting et al. |
| 9,214,581 | B2 | 12/2015 | Khoshakhlagh et al. |
| 2003/0064248 | A1 | 4/2003 | Wolk et al. |
| 2007/0215900 | A1 | 9/2007 | Maimon |
| 2008/0111152 | A1 | 5/2008 | Scott et al. |
| 2009/0084958 | A1 | 4/2009 | Vogt |
| 2009/0127462 | A1 | 5/2009 | Gunapala et al. |
| 2009/0224228 | A1 | 9/2009 | Razeghi |
| 2009/0256231 | A1* | 10/2009 | Klipstein ............. H01L 31/101 257/441 |
| 2010/0006822 | A1 | 1/2010 | Ting et al. |
| 2010/0072514 | A1 | 3/2010 | Ting et al. |
| 2010/0155777 | A1 | 6/2010 | Hill et al. |
| 2010/0230720 | A1 | 9/2010 | Wicks |
| 2011/0037097 | A1 | 2/2011 | Scott et al. |
| 2012/0145996 | A1 | 6/2012 | Ting et al. |
| 2012/0199185 | A1 | 8/2012 | Yang |
| 2013/0062593 | A1 | 3/2013 | Jones et al. |
| 2013/0146998 | A1* | 6/2013 | Ting .................. H01L 31/02016 257/431 |
| 2014/0225064 | A1 | 8/2014 | Khoshakhlagh et al. |
| 2015/0145091 | A1 | 5/2015 | Ting et al. |

OTHER PUBLICATIONS

Blazejewski et al., "Bias-switchable dual-band HgCdTe infrared photodetector", J. Vac. Sci. Technol., Jul./Aug. 1992, B10(4), pp. 1626-1632.
Byun et al., "Heterojunction fabrication by selective area chemical vapor deposition induced by synchrotron radiation", Appl. Phys. Lett, Apr. 11, 1994, vol. 64, No. 15, pp. 1968-1970.
Carras et al., "Interface band gap engineering in InAsSb photodiodes", Applied Physics Letters 87, 2005, pp. 102103-1-102103-3.
Gautam, N. et al., "Performance improvement of longwave infrared photodetector based on type-II InAs/GaSb superlattices using unipolar current blocking layers", Applied Physics Letters, 2010, vol. 96, pp. 231107-1-231107-3.
Ghosh et al., "Fabrication of the SnS/ZnO heterojunction for PV applications using electrodeposited ZnO films", Semicond. Sci. Technol., 2009, vol. 24, pp. 025024-1-025024-7.
Gotoh et al., "Molecular Beam Epitaxy of AlSb on GaAs and GaSb on AlSb Films", Phys. Stat. Sol., 1983, vol. 75, pp. 641-645.
Hill, Cory et al., "Demonstration of large format mid-wavelength infrared focal plane arrays based on superlattice and BIRD detector structures", Infrared Physics & Technology, 2009, vol. 52, pp. 348-352.
Huang et al., "Epitaxial growth and characterization of InAs/GaSb and InAs/InAsSb type-II superlattices on GaSb substrates by metalorganic chemical vapor depositions for long wavelength infrared photodetectors", Journal of Crystal Growth, 314, (2011) 92-96.

Huang et al., "Strain relief by periodic misfit arrays for low defect density GaSb on GaAs", Applied Physics Letters, 2006, vol. 88, pp. 131911-1-131911-3.
Johnson et al., "Electrical and optical properties of infrared photodiodes using the InAs/Ga1-xInXSb superlattice in heterojunctions with GaSb", J. Appl. Phys., Jul. 15, 1996, 80(2), pp. 1116-1127.
Kazzi et al., "Interplay between Sb flux and growth temperature during the formation of GaSb islands on GaP", Journal of Applied Physics, 2012, vol. 111, pp. 123506-1-123506-5.
Khoshakhlagh et al., "Bias dependent dual band response from InAs/Ga(In)Sb type II strain later superlattice detectors", Applied Physics Letters, 2007, vol. 91, pp. 263504-1-263504-3.
Kim et al., "Long-wave infrared nBn photodetectors based on INAs/InAsSb type-II superlattices", Applied Physics Letters, 2012, 101, 161114-1-161114-3.
Kim et al., "Mid-IR focal plane array based on type-II InAs/GaSb strain layer superlattice detector with nBn design", Applied Physics Letters, 2008, vol. 92, pp. 183502-1-183502-3.
Klipstein, ""XBn" Barrier Photodetectors for High Sensitivity and High Operating Temperature Infrared Sensors", Proc. of SPIE, 2008, vol. 6940, pp. 69402U-1-69402U-12.
Lackner et al., "Growth of InAsSb/InAs MQWs on GaSb for mid-IR photodetector applications", Journal of Crystal Growth, 2009, vol. 311, pp. 3563-3567.
Lackner et al., "InAsSb and InPSb Materials for Mid Infrared Photodetectors", Proceedings, 2010, IPRM, 4 pgs.
Lackner et al., "Strain balanced InAs/InAsSb superlattice structures with optical emission to 10 um", Applied Physics Letters, 2009, vol. 95, pp. 081906-1-081906-3.
Magden, "Effects of Strain Release via Interfacial Misfit Arrays on the Optical Properties of GaSb/GaAs Heterojunctions", Senior Honors Thesis, 2012, 59 pgs.
Maimon et al., "InAsSb/GlaAlSb/InAsSb nBn IR detector for the 3-5µm", Abstract Book of the 11th International Conference on Narrow Gap Semiconductors, Buffalo, New York, 2003, p. 70.
Maimon et al., "nBn detector, an infrared detector with reduced dark current and higher operating temperatures", Applied Physics Letters, 2006, vol. 89, 1511091-1511093.
Nguyen et al., "Background limited long wavelength infrared type-IInAs/SaSb superlattice photodiodes operating at 110 K", Applied Physics Letter, 2008, vol. 93, pp. 123502-1-123502-3.
Plis et al., "Lateral diffusion of minority carriers in InAsSb-based nBn detectors", Applied Physics Letters, 2010, vol. 97, pp. 123503-1-123503-3.
Reine et al., "Independently Accessed Back-to-Back HgCdTe Photodiodes: A New Dual-Band Infrared Detector", Journal of Electronic Materials, 1995, vol. 24, No. 5, pp. 669-679.
Reyner et al., "Characterization of GaSb/GaAs interfacial misfit arrays using x-ray diffraction", Applied Physics Letters, 2011, vol. 99, pp. 231906-1-231906-3.
Rogalski, "Heterostructure infrared pholovoltaic detectors", Infrared Physics & Technology, 2000, vol. 41, pp. 213-238.
Tatebayashi et al., "Monolithically Integrated III-Sb-Based Laser Diodes Grown on Miscut Si Substrates", IEEE Journal of Selected Topics in Quantum Electronics, May/Jun. 2009, vol. 15, No. 3, pp. 716-723.
Ting et al., "A high-performance long wavelength superlattice complementary barrier infrared detector", Applied Physics Letters, 2009, vol. 95, pp. 023508 1 023508 3.
Ting et al., "Exclusion, extraction, and junction placement effects in the complementary barrier infrared detector", Applied Physics Letters, 2013, vol. 102, pp. 121109-1-121109-4.
Wang et al., "Strain relief at the GaSb/GaAs interface versus substrate surface treatment and AlSb interlayers thickness", Journal of Applied Physics, 2011, vol. 109, pp. 023509-1-023509-6.
Weiss et al., "InAsSb-based XBnn bariodes grown by molecular beam epitaxy on GaAs", Journal of Crystal Growth, 2012, vol. 339, pp. 31-35.
Wicks et al., "Infrared detector epitaxial designs for suppression of surface leakage current", Proc. of SPIE, vol. 7608, pp. 760822-1-760822-8.

(56) References Cited

OTHER PUBLICATIONS

Wilk et al., "Type-II InAsSb/InAs strained quantum-well laser diodes emitting at 3.2um", Applied Physics Letters, Oct. 9, 2000, vol. 77, No. 15, pp. 2298-2300.

Zhang, "Continuous wave operation of InAS/InAsxsb1-x", Appl. Phys. Lett. Jan. 1995, 66 (2), pp. 118-120.

Zhang, "InAs/InAsxSb1-x type-II superlattice Midwave Infrared Lasers", Antimonide-Related Strained-Layer Heterostructures, edited by M. O. Manasreh, Gordon and Breach Science Publishers, Amsterdam (1997), 10 pgs.

Zhou et al., "Molecular Beam Epitaxy of GaSb on GaAs Substrates with AlSb Buffer Layers", Chin. Phys. Lett., 2009, vol. 26, No. 1, pp. 01810-1-01810-3.

\* cited by examiner

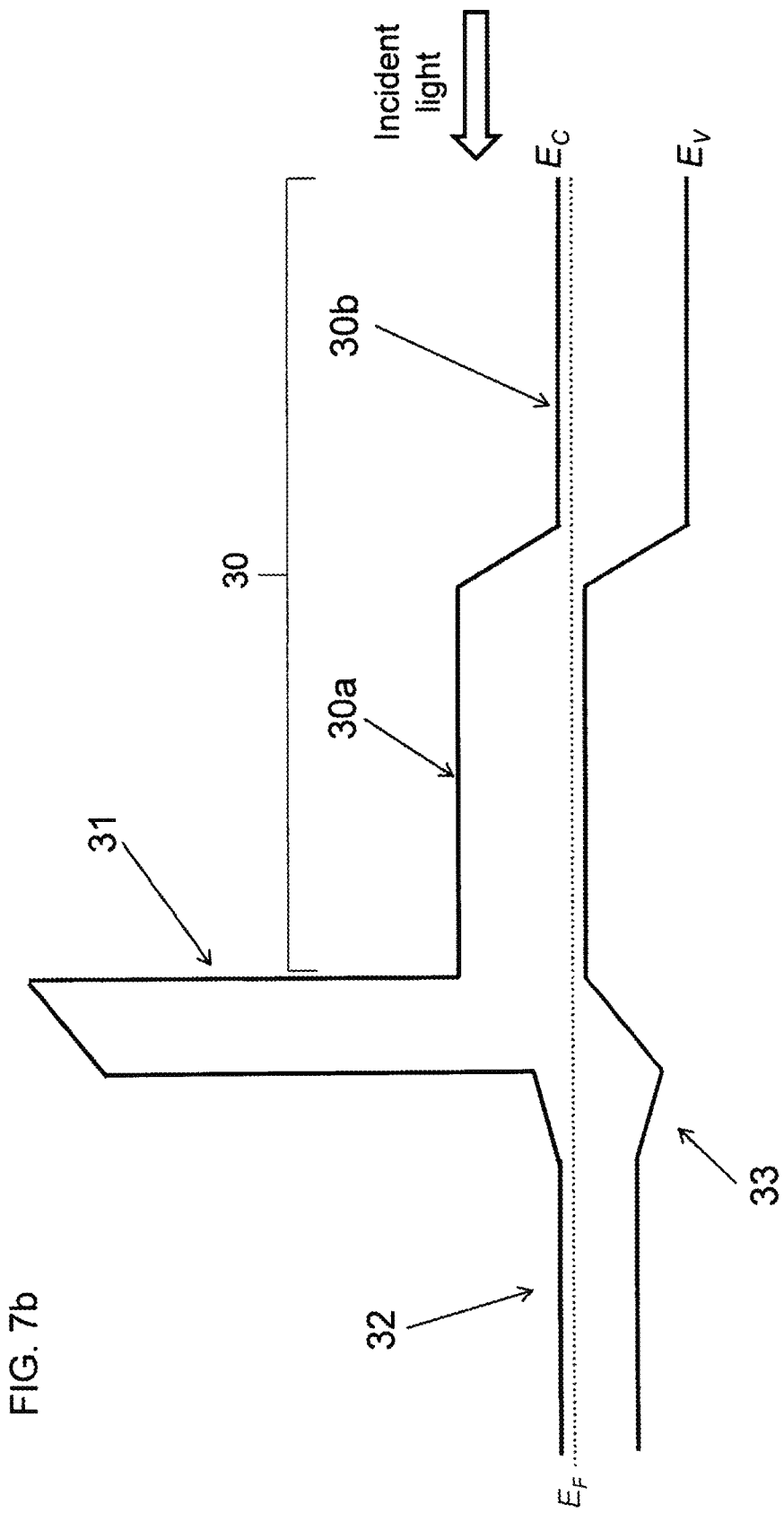

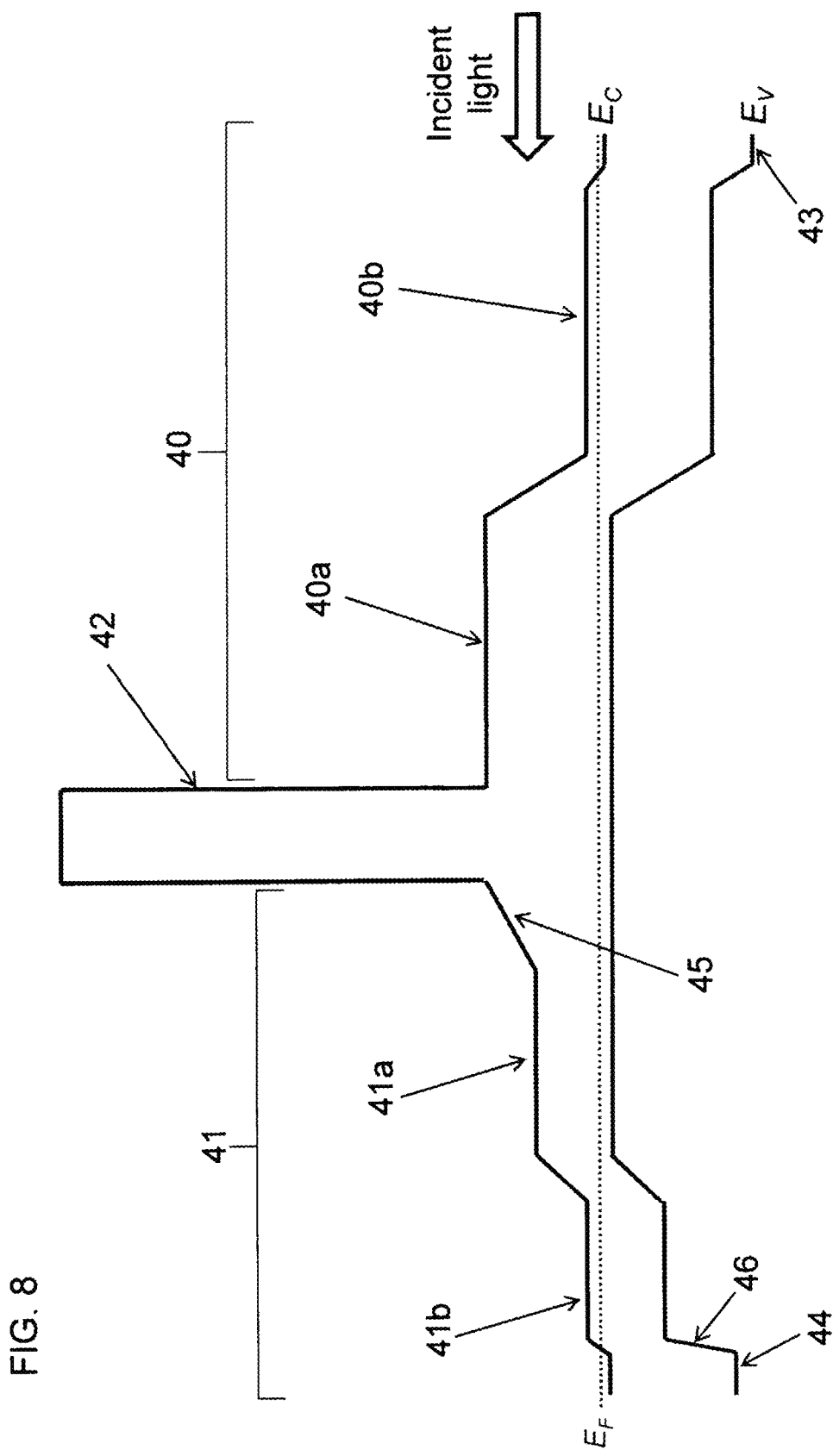

UNIPOLAR BARRIER DUAL-BAND INFRARED DETECTORS

STATEMENT OF RELATED APPLICATIONS

The current application claims priority to U.S. Provisional Application No. 62/132,936, filed Mar. 13, 2015, the disclosure of which is incorporated herein by reference.

STATEMENT OF FEDERAL FUNDING

The invention described herein was made in the performance of work under a NASA contract NNN12AA01C, and is subject to the provisions of Public Law 96-517 (35 USC 202) in which the Contractor has elected to retain title.

FIELD OF THE INVENTION

The current invention is directed to unipolar barrier dual-band infrared detectors and methods of their manufacture.

BACKGROUND OF THE INVENTION

HgCdTe-based bias-switchable dual-band (two-color) infrared detectors have been reported in the literature since the early 1990s. The typical device structure consists of two back-to-back infrared photodiodes, each designed to detect a particular color band. The two diodes are monolithically integrated, typically in an n-P-N(capital letters denote material layers with wider band gap) three-layer design or an n-p-P-N four-layer design. (See, e.g., J. M. Arias, et al., *J. Appl. Phys.* 70, 4620-4622 (1991); E. R. Blazejewski, et al., *J. Vac. Sci. Technol. B*10, 1626-1632 (1992); and M. B. Reine, et al., *J. Electron. Mater.* 24, 669-679 (1995), the disclosures of each of which are incorporated herein by reference. The topic has been well documented in books and review articles. (See, e.g., A. Rogalski, *Infrared Physics & Technology* 41, 231-238 (2000), the disclosure of which is incorporated herein by reference.)

Recently, type-II superlattices (e.g., InAs/GaSb or InAs/GaInSb) have emerged as viable alternatives to HgCdTe for infrared detection. The performance of type-II superlattice based infrared detectors can be enhanced by using heterostructure designs such as the nBn, pBp, double heterostructure (DH), or complementary barrier infrared detector (CBIRD). (See, e.g., A. M. White, U.S. Pat. No. 4,679,063; S. Maimon and G. W. Wicks, *Appl. Phys. Lett.* 89(15) 151109 (2006); S. Maimon, U.S. Pat. No. 7,687,871 B2; J. L. Johnson, et al., *Appl. Phys. Lett.* 80(2) 1116-1127 (1996); B.-M. Nguyen, et al., *Appl. Phys. Lett.* 93(12) 123502 (2008); and D. Z.-Y. Ting, et al., *Appl. Phys. Lett.* 95, 023508 (2009), the disclosures of each of which are incorporated herein by reference.) These device structures make use of unipolar barriers, which can block one carrier type (electron or hole) but allow the un-impeded flow of the other. Type-II superlattices have also been used in bias-switchable dual-band infrared detectors. A simple method involves the two-color nBn design, where an electron-blocking (but not hole-blocking) unipolar barrier is inserted between two n-doped infrared absorbers with different energy band gaps. Dual-band nBn detectors implemented using type-II InAs/Ga(In)Sb superlattices have been reported in the literature. (See, A. Khoshakhlagh, et al., *Appl. Phys. Lett.* 91, 263504 (2007), the disclosure of which is incorporated herein by reference.)

SUMMARY OF THE INVENTION

The disclosure is directed to dual-band barrier infrared detectors having enhanced quantum efficiency and/or reduced spectral crosstalk, and methods of their manufacture. In particular, the current disclosure demonstrates high-performance dual-band barrier infrared detectors using novel absorber structures that incorporate both n- and p-type materials to construct any suitable dual-band barrier infrared detector, including npBPN, nBPN, pBPN, npBN, npBP, pBN and nBP structures.

Many embodiments are directed to a detector structure including:
- an electron unipolar barrier having first and second sides;
- a first absorber disposed on the first side of the unipolar barrier and comprising at least a first absorber structure formed from at least a first absorber material having a first bandgap;
- a second absorber disposed on the second side of the unipolar barrier and comprising at least a second absorber structure formed from at least a second absorber material having a second bandgap and being, wherein the second bandgap is narrower than the first bandgap;
- wherein the valence band edges of the unipolar barrier and first and second absorbers are configured to minimize offset therebetween;
- wherein at least one of the first and second absorbers comprises an absorber structure formed from an n-type absorber material, and wherein at least one of the first and second absorbers comprises an absorber structure formed from a p-type absorber material; and
- wherein that thicknesses of each of the absorber structures of the first and second absorbers are less than the characteristic diffusion length of the absorber material from which the respective absorber structure is formed.

In other embodiments at least one of the first or second absorbers is multi-segmented comprising at least two absorber structures, wherein one of the absorber structures is formed from an n-type absorber material and one of the absorber structures is formed from a p-type absorber material. In some such embodiments the detector includes at least one graded-gap transition region being disposed between the absorber structures of the multi-segmented absorber and configured to minimize offset between the band edges of the individual segments of the multi-segmented absorber.

In still other embodiments both the first and second absorbers are multi-segmented each comprising at least two absorber structures, wherein one of the absorber structures is formed from an n-type absorber material and one of the absorber structures is formed from a p-type absorber material. In some such embodiments the detector further includes at least one graded-gap transition region being disposed between the segments of each of the multi-segmented absorbers and configured to minimize offset between the band edges of the individual segments of each of the multi-segmented absorbers.

In yet other embodiments the unipolar barrier is graded.

In still yet other embodiments the unipolar barrier is ungraded and further comprising at least one graded-gap transition region being disposed between the unipolar barrier and one of either the first or second absorber, and configured to minimize offset between the valence band edges of the absorber and the unipolar barrier.

In still yet other embodiments the detector further includes a contact layer disposed distal to each of the absorbers; and at least one graded-gap transition region being disposed between at least one of the contact layers and one of either the first or second absorber, and configured to minimize offset between the band edges of the absorber and the contact layer.

In still yet other embodiments the detector further includes at least one graded-gap transition region being disposed within the detector structure and configured to minimize offset between the valence band edges of one or more absorbers to the barrier layer, wherein the graded-gap comprises a superlattice formed from a plurality of repeated layers of at least two semiconductor materials, each layer being defined by a layer thickness such that each superlattice has a period defined by the combined thicknesses of the plurality of repeated layers, and wherein the energy band gap structure of each superlattice including the band gap, conduction band edge and the valence band edge depends on the composition, thickness and period of the plurality of the repeated layers.

In still yet other embodiments both the first and second absorbers each comprise at least one absorber structure formed of a p-type absorber material and at least one absorber structure formed of an n-type absorber material.

In still yet other embodiments the first absorber comprises at least one absorber structure formed of a p-type absorber material and at least one absorber structure formed of an n-type absorber material, and wherein the second absorber comprises a single absorber structure formed of one of either an n-type or a p-type absorber material.

In still yet other embodiments the second absorber comprises at least one absorber structure formed of a p-type absorber material and at least one absorber structure formed of an n-type absorber material, and wherein the first absorber comprises a single absorber structure formed of one of either an n-type or a p-type absorber material.

In still yet other embodiments the first and second absorbers are each different and each comprise a single absorber structure formed of one of either an n-type or a p-type absorber material.

In still yet other embodiments the n-type absorber structures are formed from a graded-gap material.

In still yet other embodiments the detector further includes at least one contact layer disposed on the side of each absorber distal to the unipolar barrier, and wherein the contact layers are formed of a doped n-type material and have a wider band gap material than the band gap of the adjacent absorber. In some such embodiments the detector further includes graded-gap transition regions between either of the absorbers and the adjacent contact layer and configured to allow the free flow of electrons therebetween.

In still yet other embodiments the detector further includes a contact layer disposed distal to each of the absorbers, and a hole unipolar barrier between either of the absorbers and the adjacent contact layer.

Other embodiments are directed to methods of forming a detector structure including:
  providing a first and a second absorber wherein at least one of the first and second absorbers comprises an absorber structure formed from at least an n-type absorber material, and wherein at least one of the first and second absorbers comprises an absorber structure formed from at least a p-type absorber material;
  interconnecting the absorbers through a unipolar barrier;
  connecting the ends of the first and second absorbers distal to the unipolar barrier each to a separate contact layer;
  wherein the valence band edges of the unipolar barrier and first and second absorbers are configured to minimize offset therebetween; and
  wherein that thicknesses of each of the absorber structures of the first and second absorbers are less than the characteristic diffusion length of the absorber material from which the respective absorber structure is formed.

In alternative embodiments the method further includes inserting at least one graded gap transition region between at least one junction selected from the group consisting of: the junction between the unipolar barrier and at least one of the absorbers wherein the graded gap transition region is configured to minimize the offset between the valence band edges at the junction, the junction between individual structures within a multi-segmented absorber wherein the graded gap transition region is configured to minimize the offset between the band edges at the junction, and the junction between a contact layer and an absorber wherein the graded gap transition region is configured to minimize the offset between the band edges at the junction.

In still other embodiments the methods includes inserting at least one hole unipolar barrier between at least one contact layer and an adjacent absorber.

Additional embodiments and features are set forth in part in the description that follows, and in part will become apparent to those skilled in the art upon examination of the specification or may be learned by the practice of the disclosed subject matter. A further understanding of the nature and advantages of the present disclosure may be realized by reference to the remaining portions of the specification and the drawings, which forms a part of this disclosure.

BRIEF DESCRIPTION OF THE DRAWINGS

These and other features and advantages of the present invention will be better understood by reference to the following detailed description when considered in conjunction with the accompanying data and figures, wherein:

FIG. 7b provides a schematic energy band diagram of a dual-band infrared detector with a constant-gap electron blocking unipolar barrier, and a graded-gap transition region connecting the barrier and the narrower-gap absorber where the wider-gap Absorber 1 consists of a p-type section and an n-type section, while the narrow-gap Absorber 2 is n-type in accordance with embodiments of the invention.

FIG. 8 provides a schematic energy band diagram of an npBPN dual-band infrared detector in accordance with embodiments of the current invention.

DETAILED DESCRIPTION OF THE INVENTION

The current invention is directed to dual-band barrier infrared detectors having structures configured to enhance the quantum efficiency and/or to reduce spectral crosstalk between spectral bands, and methods of their manufacture. In particular, the current invention provides dual-band device structures for constructing high-performance barrier infrared detectors having reduced crosstalk using novel combinations of p-type and n-type absorber regions. In various embodiments, the detectors incorporate one absorber region that is p-type and one absorber region that is n-type. In many embodiments, the novel absorber regions are multi-segmented and comprise both p-type and n-type absorber sections. In some embodiments the individual absorber segments have a thickness below their respective diffusion lengths. Utilizing such novel absorber combinations it is possible to construct any suitable barrier infrared detector having enhanced the quantum efficiency and/or reduced crosstalk, including, for example, npBPN, nBPN, pBPN, npBN, npBP, pBN and nBP structures.

Figure 1:
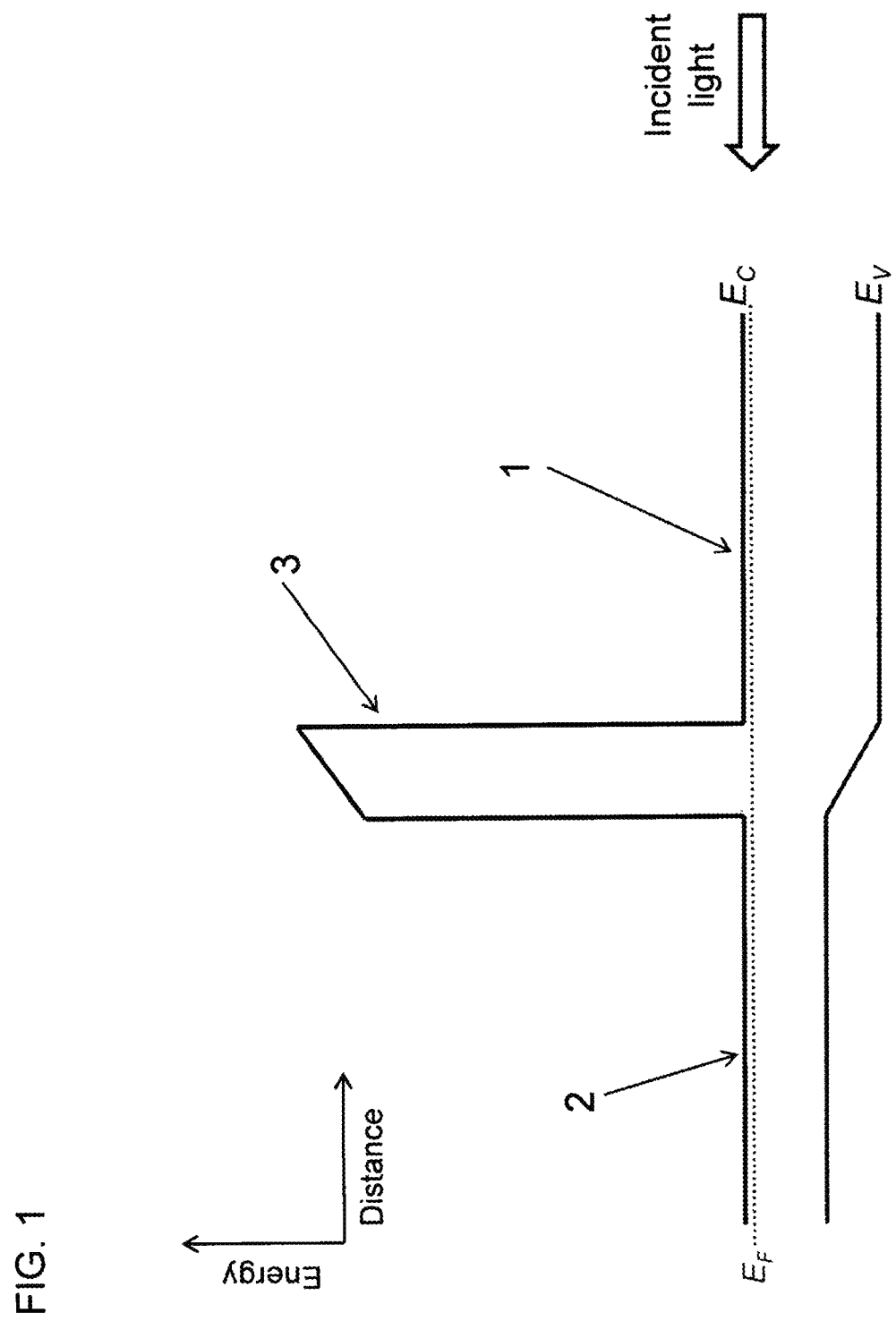
FIG. 1 provides a schematic energy band diagram of an nBn dual-band infrared detector with a graded-gap electron blocking unipolar barrier in accordance with the prior art.
Figure 2:
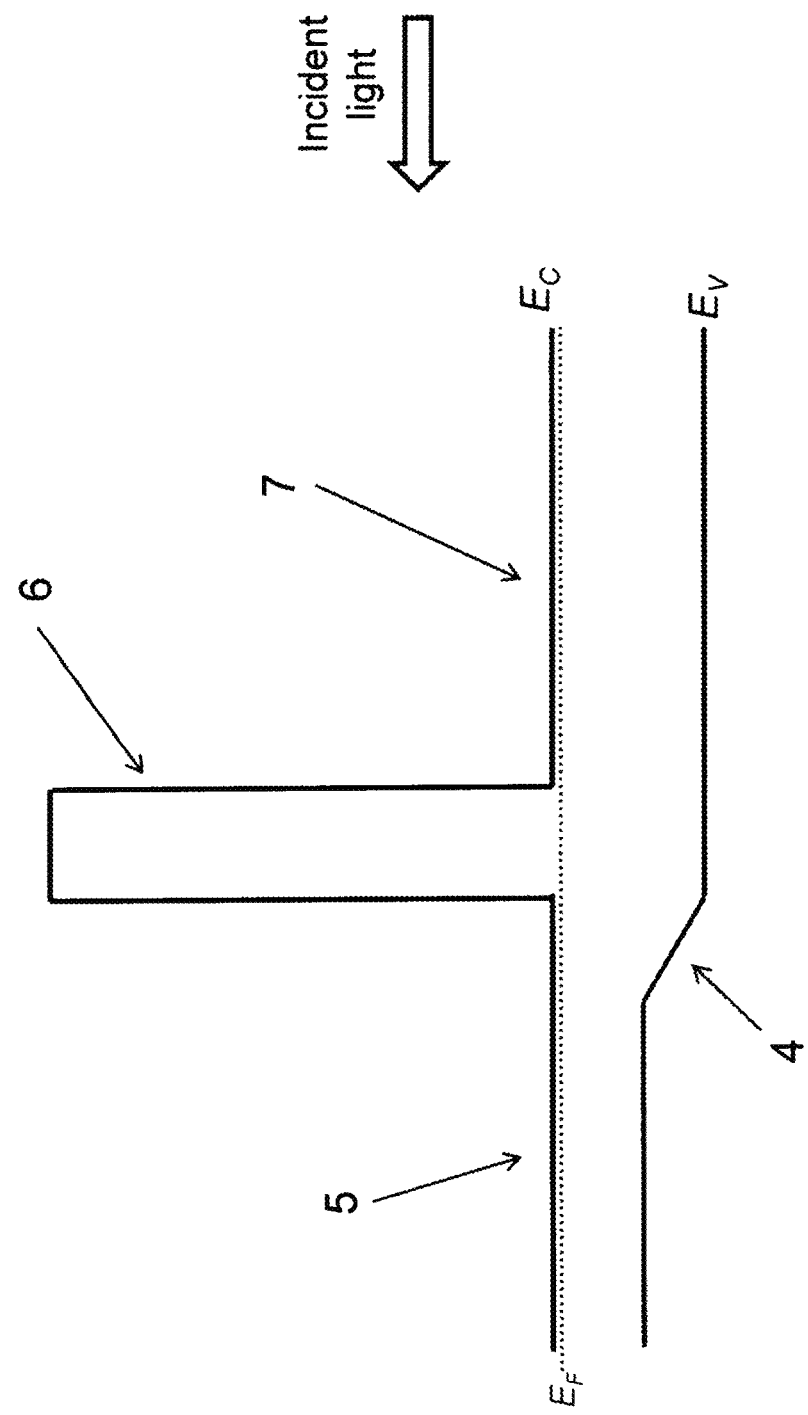
FIG. 2 provides a schematic energy band diagram of an nBn dual-band infrared detector with a constant-gap electron blocking unipolar barrier, and a graded-gap transition region connecting the barrier and the narrower-gap absorber in accordance with the prior art.

Dual-band nBn detectors having infrared absorbers (e.g., based on InAs/InAsSb type-II superlattices) paired with a matching graded band gap (3) unipolar electron barrier that smoothly connects the valence band edges of the two absorbers, as shown in FIG. 1, are known. (See, e.g., U.S. Pat. No. 8,217,480, the disclosure of which is incorporated herein by reference.) An alternative dual-band nBn detector design that incorporates a graded-gap region within one or both of the absorber layers is illustrated in FIG. 2. (See, e.g., U.S. patent application Ser. No. 14/216,932, the disclosure of which is incorporated herein by reference.) Both of these designs are based on the nBn architecture, where a barrier ("B") separates two different n-type infrared absorbers ($A_1$ and $A_2$) with different band gaps $E_{g,1}$ for and $E_{g,2}$. The barrier layer in such nBn detectors interrupts the flow of majority carriers (electrons) between the two n-type absorbers, in the same way that the 'P' layer does in conventional nPN detector structures.

Figure 3:
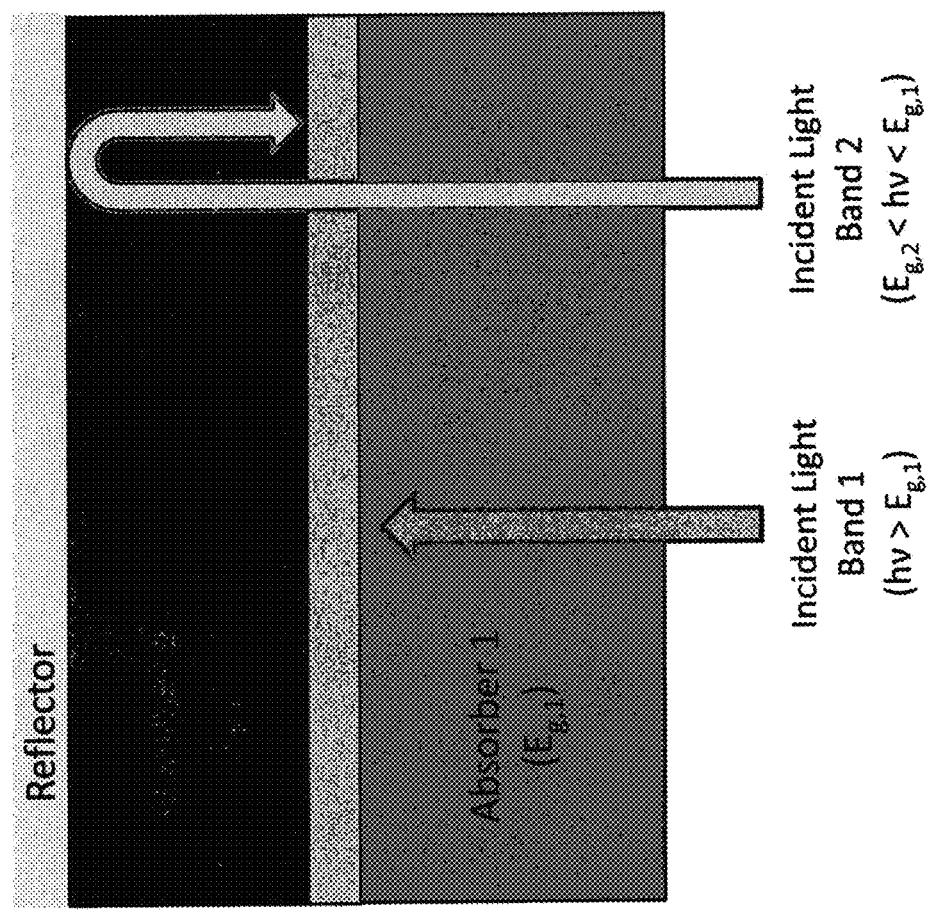
FIG. 3 provides a schematic illustration of the device geometry of a simple dual-band infrared detector in accordance with the prior art.

In the case of the structure shown in FIG. 1, the absorbers (1 and 2) are separated by graded-gap electron-blocking unipolar barrier (3), which substantially matches the valence band edges of both of the infrared absorbers at the two barrier-absorber interfaces. In the case of the structure shown in FIG. 2 valence band edge ($E_v$) matching is achieved by introducing a graded-gap transition layer (4) that smoothly connects the valence band edges of "Absorber 2" (5) and the constant-gap electron barrier (6), which is valence-band edge matched to "Absorber 1" (7). In both cases, the absorber with the larger band gap ("Absorber 1") is arranged to be closer to the light incidence surface. "Absorber 1" can absorb photons with energy (hv) greater than $E_{g,1}$, while "Absorber 2" can absorbs photons with energy greater than $E_{g,2}$. Ideally, as schematically illustrated in the simplified device geometry shown in FIG. 3, Absorber 1 should absorb nearly all the photons with energy larger than $E_{g,1}$ in one pass, leaving Absorber 2 to absorb photons with energy between $E_{g,2}$ and $E_{g,1}$ (Recall $E_{g,2}<E_{g,1}$). Accordingly, within this dual-band detector structure, Absorber 1 serves to detect photons with $hv>E_{g,1}$ (Band 1), while Absorber 2 is designated to detect photons with $E_{g,2}<hv<E_{g,1}$ (Band 2). As further illustrated in FIG. 3, typically there is a reflector at the top of the structure so that photons can be reflected back into the detector structure, thereby at least doubling the absorption path length in Absorber 2. However, a problem arises if Absorber 1 cannot absorb all the photons in Band 1 in a single pass. In such instances the surviving Band-1 photons can still be absorbed by Absorber 2 thus creating a false signal in Absorber 2. This "spectral crosstalk" (i.e., Absorber 2 detecting photons in Band 1) needs to be minimized to allow the detector to distinguish Band 1 and Band 2 photons.

One solution that has been used to minimize such spectral crosstalk is to increase the thickness of Absorber 1 so that it absorbs (nearly) all the Band 1 photons in a single pass. However, this can be problematic in cases where the absorbers are made from materials (such as some type-II superlattices) that have limited hole diffusion length. A general concern with using n-doped type-II superlattices as infrared absorbers has to do with the unfavorable hole mobility characteristics. Semiconductor transport is controlled primarily by the properties of minority carriers, which are holes in the case of n-type material. The hole mobility of a type-II superlattice such as InAs/InAsSb is generally highly anisotropic. Hole mobility is considerably lower in the direction perpendicular to the superlattice layer interfaces than in the lateral (in-plane) directions. This low hole mobility results in short hole diffusion length. In particular, if the n-type Absorber 1 thickness required for sufficient single-pass absorption is noticeably longer than its hole diffusion length, the photo-excited minority carriers (holes) will not be collected as photocurrent, thereby reducing the Band-1 quantum efficiency.

Figure 4:
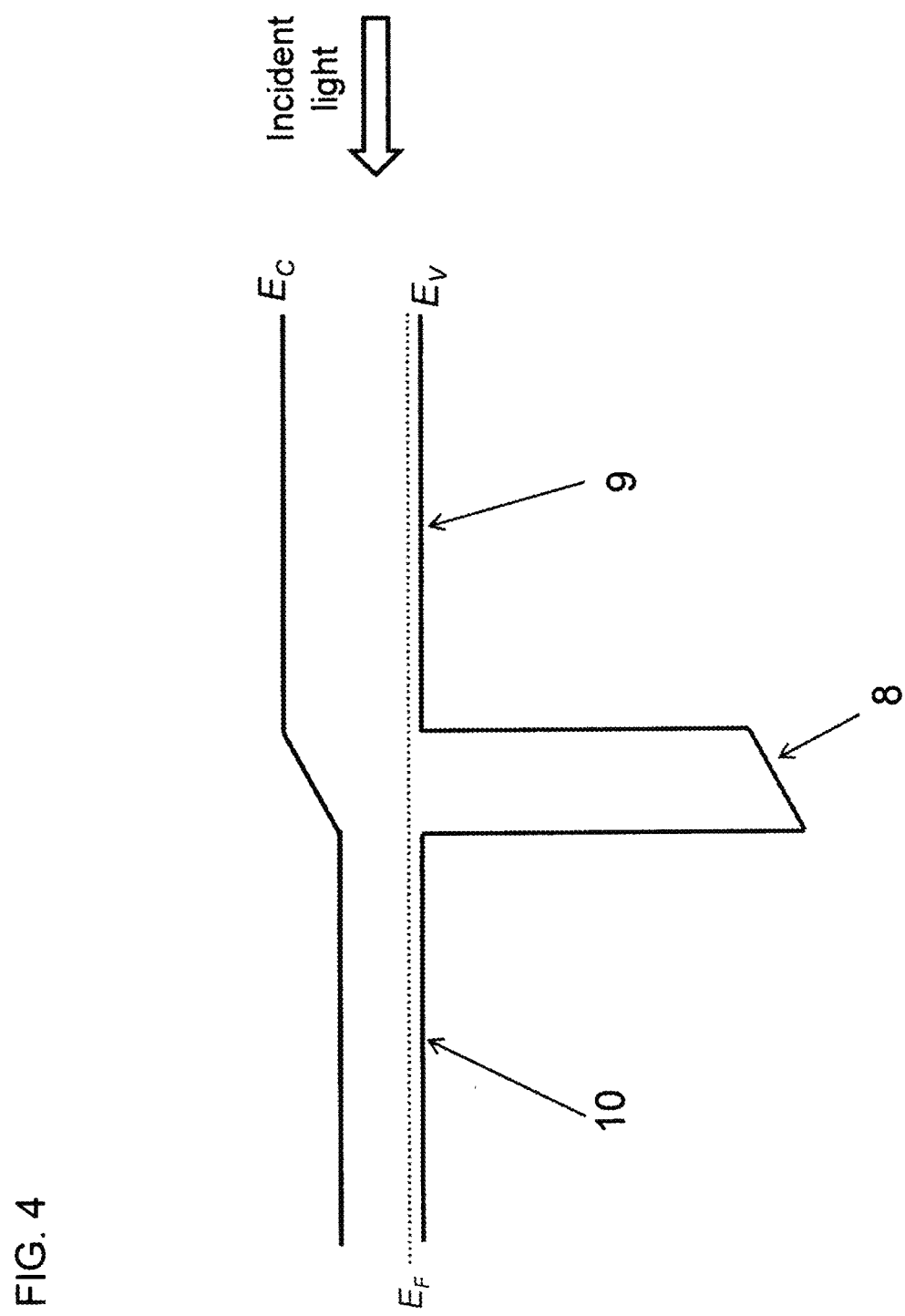
FIG. 4 provides a schematic energy band diagram of a pBp dual-band infrared detector with a hole blocking unipolar barrier in accordance with the prior art.

An alternative approach is to use a dual-band pBp design. A pBp detector structure consists of a hole-blocking (but not electron-blocking) unipolar barrier (8) sandwiched between two p-doped infrared absorbers (9 and 10) with different energy band gaps, as illustrated in FIG. 4. Similar to the nBn, the 'B' layer in the pBp interrupts the flow of majority carriers (holes in this case) between the two p-type absorber regions. In type-II superlattices such as InAs/GaSb, electron mobility is high and nearly isotropic. The problems associated with unfavorable anisotropic hole mobilities and diffusion lengths in n-type superlattice infrared absorbers are greatly reduced in pBp structures where electrons are minority carriers. The p-type absorber layers can be made thicker for sufficient quantum efficiency. However, the pBp structure has its own drawbacks. Unlike the nBn design, which is capable of reducing electron surface leakage current, the pBp design is susceptible to this mechanism. (See, e.g., G. W. Wicks, G. R. Savich, J. R. Pedrazzini, and S. Maimon, *Proc. of SPIE* 7608, 760822 (2010), the disclosure of which is incorporated herein by reference.) Consider a reticulated detector pixel with exposed sidewalls. A type-II superlattice containing InAs layers is likely to develop an accumulation of electrons on the sidewall surface (InAs surface Fermi level is pinned in the conduction band, independent of doping type). This turns the sidewall surface into n-type. Since there are no electron barriers in a pBp structure, electron surface leakage current can flow un-impeded from one electrode to the other. This can result in a sizable dark current that reduces detector sensitivity.

Figure 5:
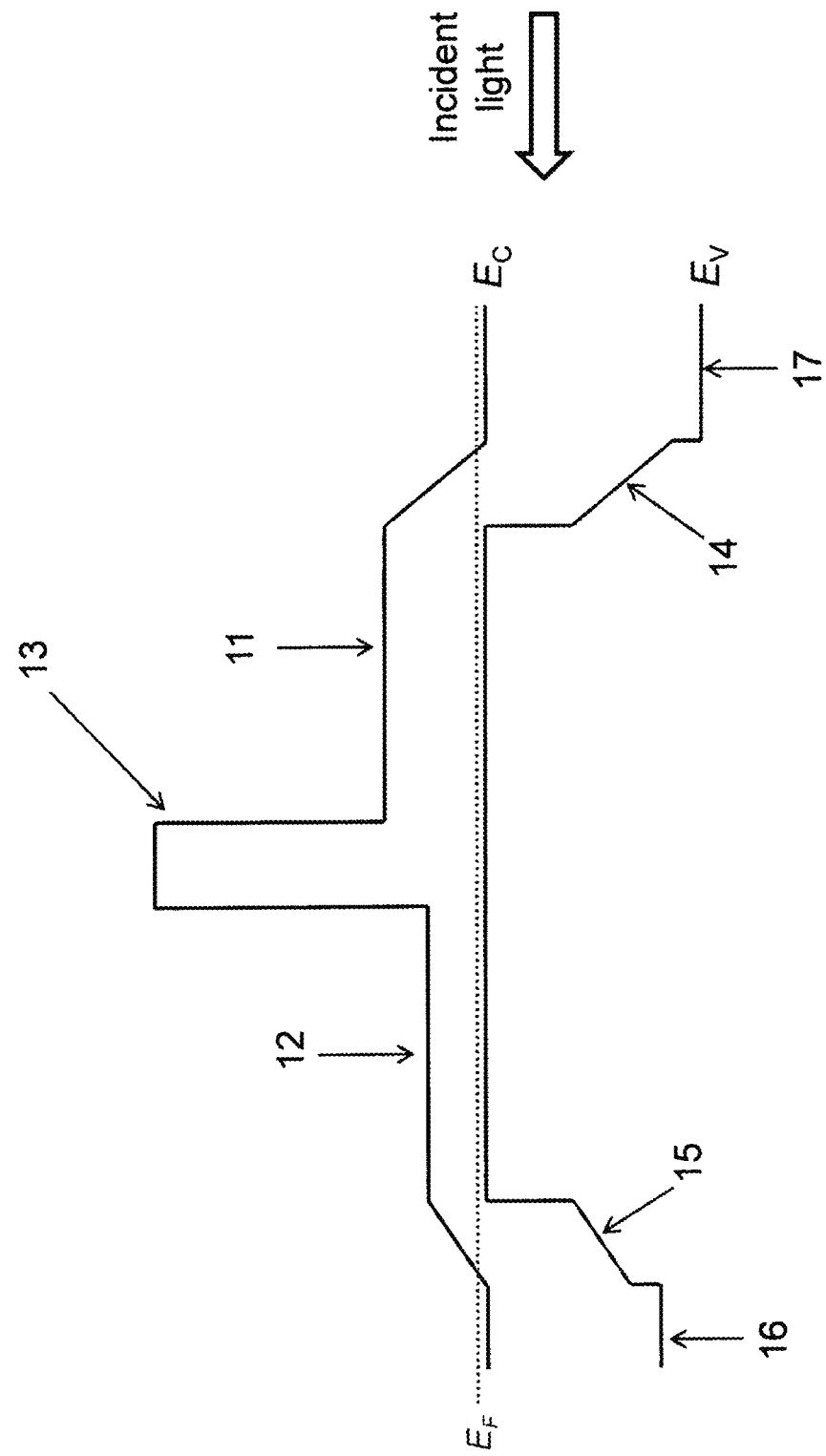
FIG. 5 provides a schematic energy band diagram of a back-to-back complementary barrier infrared detector (BBCBIRD) with an electron blocking unipolar barrier in accordance with the prior art.

Still another approach that has been attempted is to use a back-to-back complementary barrier infrared detector (BBCBIRD) design (See U.S. Pat. No. 8,928,029, the disclosure of which is incorporated herein by reference.) as illustrated in FIG. 5. In the BBCBIRD design each of the two p-type absorbers (11 and 12) are surrounded by a pair of (complementary) electron (13) and hole unipolar barriers (14 and 15)(the electron barrier is shared by the two absorbers). As in the pBp, the BBCBIRD uses p-type absorbers to achieve high quantum efficiency. As in the HgCdTe p-n-N-P structure, the flow of majority carriers is blocked by the surrounding barriers. In a delineated pixel with exposed sidewall surfaces, the middle electron unipolar barrier serves to block electron surface leakage current. In the BBCBIRD structure, the top electrical contact is made to the Contact 2 layer (16)(on the top side), while a deep etch is required for the bottom electrical contact to reach the Contact 1 layer (17)(the incident light in the figure comes from the bottom side). As a result, Contact 1 layer needs to be made sufficiently thick to allow etch depth tolerance. This structural constraint is in contrast to the nBn or the pBp structures, where it is only required to etch past the 'B' layer to make the bottom electrical contact.

To address the problems of spectral crosstalk between bands and/or the need for enhancing quantum efficiency without imposing excessive demands on fabrication and growth in such dual-band infrared detectors, many embodiments of the invention are directed to detectors comprising absorbers that incorporate both p-type and n-type structures (e.g. either separately across the absorbers or within one or more multi-segmented absorber structures). In some such embodiments, the absorbers of such detectors may be formed of both p-type and n-type absorber sections, which differs from conventional dual-band detectors where absorbers are made from either both n-type or both p-type materials. In other such embodiments the thicknesses of each of the individual segments of the absorbers of the dual-band infrared detectors are configured such that they are below the diffusion length of the absorber material. Using such absorber structures, infrared detectors with reduced spectral crosstalk and/or enhancing quantum efficiency can be constructed, as will be described in greater detail below.

Figure 6:
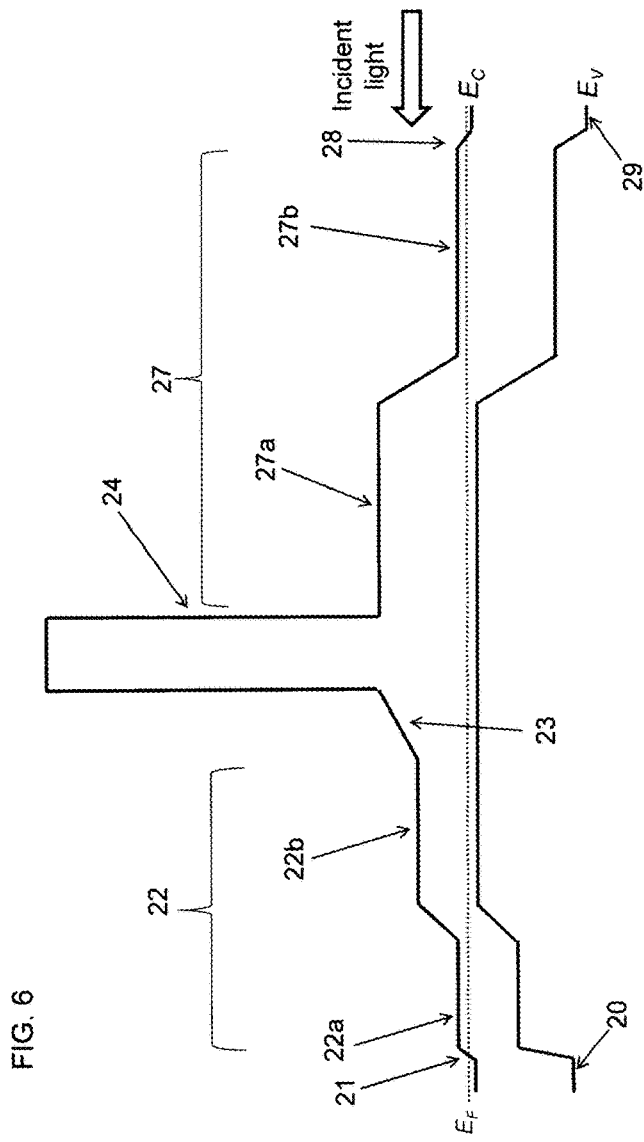
FIG. 6 provides a schematic energy band diagram of a dual-band infrared detector with two multi-segmented absorber sections in accordance with embodiments of the invention.

FIG. 6 provides a schematic of a dual-band detector that incorporates both p-type and n-type absorber sections in accordance with embodiments. Although many variations of the basic design shown in FIG. 6 is possible, as illustrated, the generalized structure consists of, in order: a top contact layer (20)/an optional transition layer (21)/an Absorber 2 (22), which may be multi-segmented and formed of: an n-type Absorber 2 (22a)/a p-type Absorber 2 (22b) /an optional transition layer (23)/a unipolar electron barrier (24)/an optional transition layer (not shown)/an Absorber 1 (27), which may be multi-segmented and formed of: a p-type Absorber 1 (27a)/n-type Absorber 1 (27b)/a transition layer (28)/a bottom contact layer (29). Although one specific dual-band detector structure is shown in FIG. 6, it will be understood that many variations of this generalized structure may be used. For example, as discussed above, some of the layers in the generalized structure are optional. Accordingly, in some embodiments not all of the absorber and transition layers are necessary. However, at least one of the absorber sections (e.g., either Absorber 1 or Absorber 2) of the dual-band detector incorporates a p-type structure (either monolithic or multi-segmented) and at least one of the absorber sections (e.g., either Absorber 1 or Absorber 2) incorporates an n-type structure (again either monolithic or multi-segmented).

Turning to the structures of the various layers of the multi-segmented dual-band detectors of embodiments, it should be understood that many suitable layers may be incorporated into the detectors. For example, in some embodiments the n-type absorber layers are formed from a graded-gap material to promote minority carrier collection. In other embodiments the contact layers may be doped n-type and may be formed of a wider band gap material than the absorbers. In still other embodiments, the transition layers between either of the absorbers and the adjacent contact layer are configured such that they do not block the flow of minority carriers from the absorber to the contact. In embodiments where either Absorber 1 or Absorber 2 consists of only p-type absorber section, a transition layer between the p-type absorber and the contact layer could be made from a wider band gap unipolar hole barrier for the purpose of dark current suppression. Likewise, in many embodiments the transition layer between one or both of the absorbers (i.e., the absorber segment adjacent the barrier) and the unipolar electron barrier is configured to provide a smooth connection between the valence band edges of the absorber (i.e., absorber segment) and the electron unipolar barrier by minimizing any valence band offsets.

The structure and formation of grade-gap regions (e.g., transitions and/or barrier layers) in accordance with embodiments may be formed of superlattice structures. A superlattice structure generally comprises a plurality of layers of semiconducting materials disposed on a substrate (not shown). In these embodiments, the band gap structure is determined by the combination of the lowest conduction subband and the highest heavy-hole subband. In particular, the superlattice energy bandgap, is determined by the separation of the bands at the zone center, and the band edge positions of the bands, which can be varied by varying the period of the superlattice. By varying the layer widths (period) and compositions within these superlattice structures a superlattice that has the desired band gap structure and a configuration that is minimally strained in relation to the underlying substrate may be engineered. Accordingly, in many embodiments of the graded-gap regions (including transition regions) the period of the superlattice structure may be configured to grade the transition between the unipolar barrier and the absorber. Accordingly, by chirping (gradually changing the period) of the superlattice it is possible to grade the band gap such that it interconnects the band edges of the smaller and larger band gap superlattices. The use of these superlattice structures and chirped superlattice structures allows for the facile construction of the graded-gap transition regions, because in such embodiments it is not necessary to change the composition of the bulk materials. In addition, the chirping maybe utilized to preserve strain-balancing throughout (i.e., the proportional stretching scheme preserves the strain balancing). (A full discussion of such superlattice structures may be found, for example, in U.S. Pat. No. 8,217,480 and U.S. patent application Ser. No. 14/216,932, the disclosures of which are incorporated herein by reference.)

Although a specific example of a dual-band infrared detector incorporating multi-segmented absorbers is described above, it should be understood that the same construction may be used to form other detector structures in accordance with other embodiments.

Figure 7A:
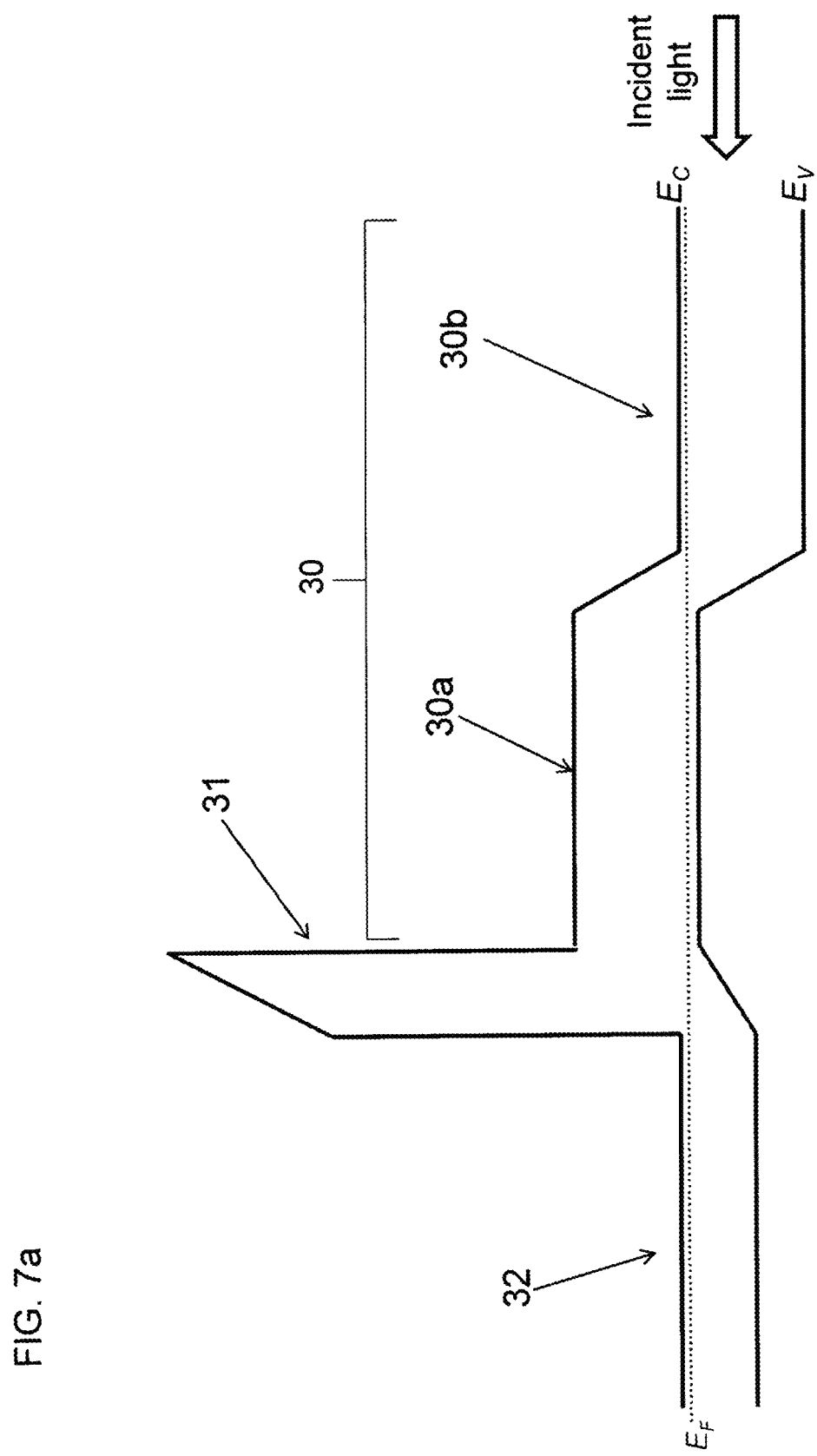
FIG. 7a provides a schematic energy band diagram of a dual-band infrared detector with a graded-gap electron blocking unipolar barrier where the Absorber 1 consists of a p-type section and an n-type section in accordance with embodiments of the invention.

Exemplary embodiments of two nBn dual-band device structures that each incorporate a single multi-segmented absorber in accordance with embodiments are illustrated in FIGS. 7a and 7b. More specifically, in FIGS. 7a and 7b the dual-band structures shown in FIGS. 1 and 2 are modified to reduce crosstalk by inserting a layer of a p-type Absorber 1 material (30a) between the electron barrier (31) and the n-type Absorber 1 (30b). In each case, the thicknesses of the individual absorber segments (30 and 32) are configured to be below their respective diffusion lengths such that photogenerated carriers can be collected. Although many configurations may be used, in some embodiments the p-type material minority carrier (30a) (electron) diffusion length is longer than that for n-type material (30b), using such a construction it is then possible to increase the total Absorber 1 (p-type and n-type) thickness substantially to increase the combined Absorber 1 (30) single-pass absorption for reduced spectral crosstalk. The presence of a p-n junction in Absorber 1 (30) has the possibility of introducing a depletion region at the junction, which is a source of generation-recombination (G-R) dark current. However, since these dual-band detectors are typically cooled during operation to accommodate the narrower-gap Absorber 2 (32), the dark current from Absorber 1 (30), even with the added G-R dark current from the p-n junction, does not introduce substantial noise.

It will be understood that the novel absorbers described in accordance with embodiments may be incorporated into dual-band detectors of many different designs. For example, as shown in FIGS. 7a and 7b, the multi-segmented absorbers (30) may be utilized with graded-gap unipolar barrier structures (31) such as those described in U.S. Pat. No. 8,217,480 (cited above), and with detectors that incorporate graded-gap transition regions (33) between the absorber (e.g., in this case Absorber 2 (32)) and the barrier (31) such as those described in U.S. patent App. Ser. No. 14/216,932 (cited above).

Figure 9:
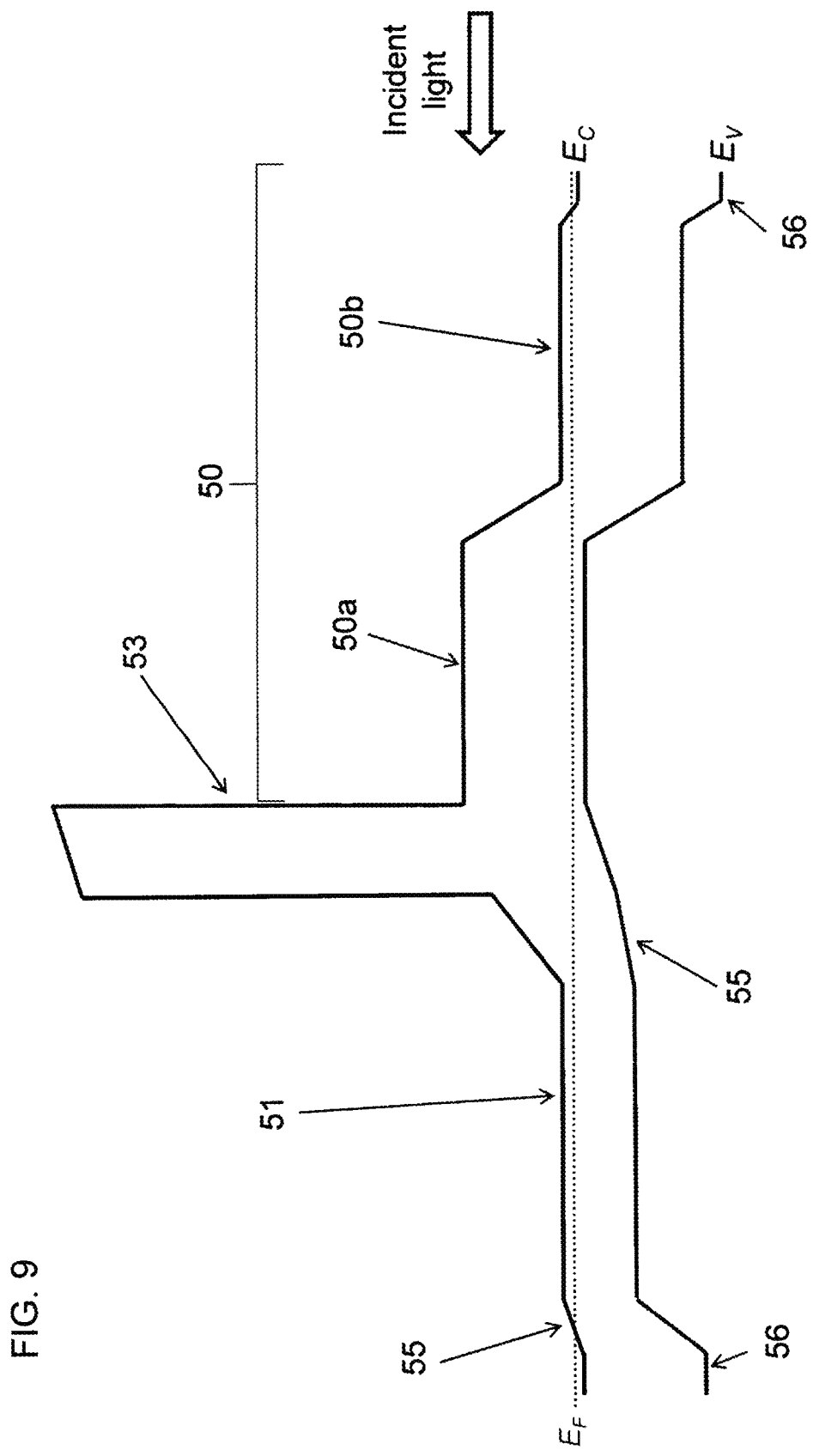
FIG. 9 provides a schematic energy band diagram of an nBPN dual-band infrared detector in accordance with embodiments of the current invention.
Figure 10:
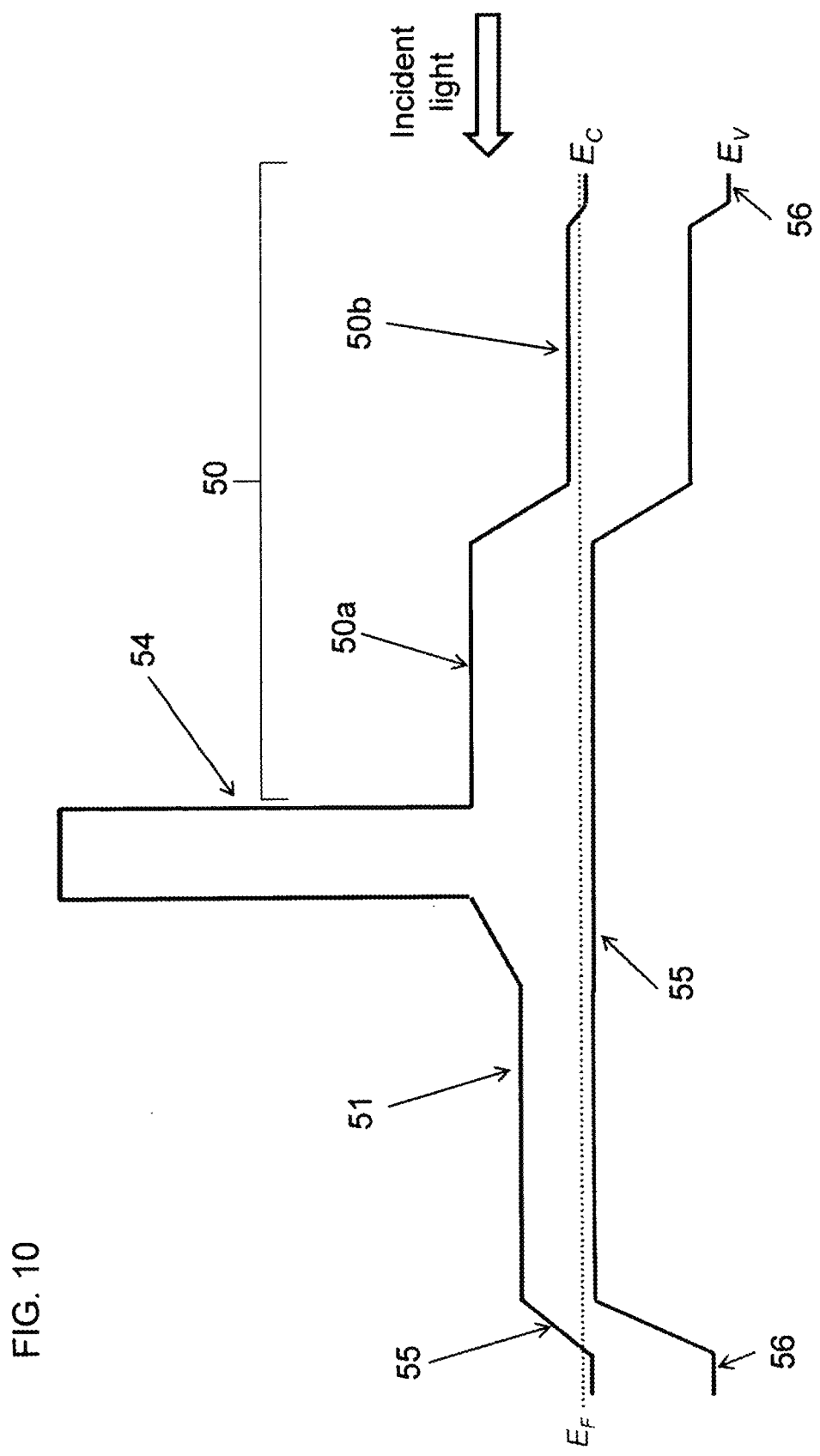
FIG. 10 provides a schematic energy band diagram of a pBPN dual-band infrared detector in accordance with embodiments of the current invention.
Figure 11:
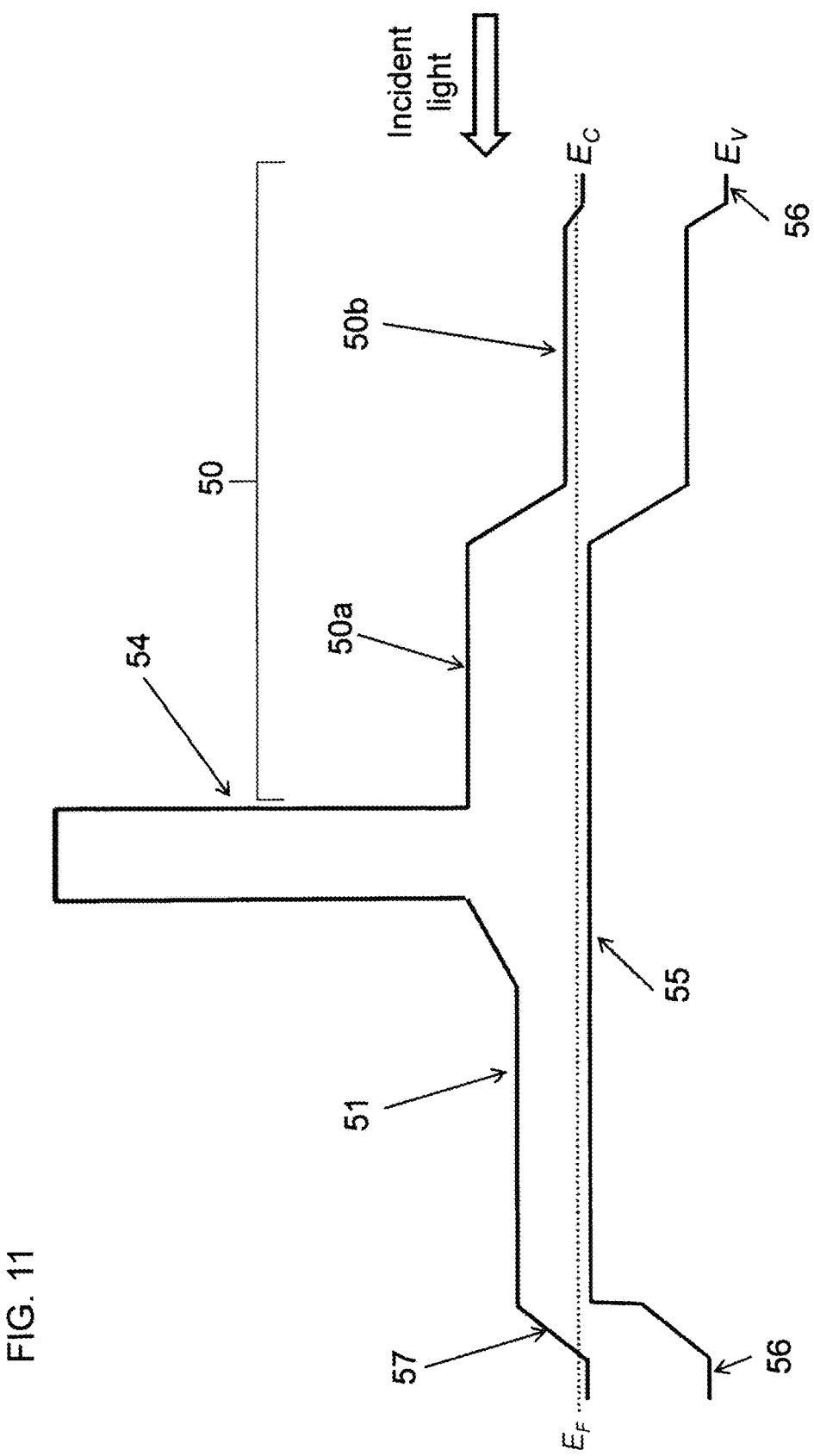
FIG. 11 provides a schematic energy band diagram of a pBPN dual-band infrared detector with a hole unipolar barrier transition region in accordance with embodiments of the current FIG. 12 provides a schematic energy band diagram of an npBN dual-band infrared detector in accordance with embodiments of the current invention.
Figure 12:
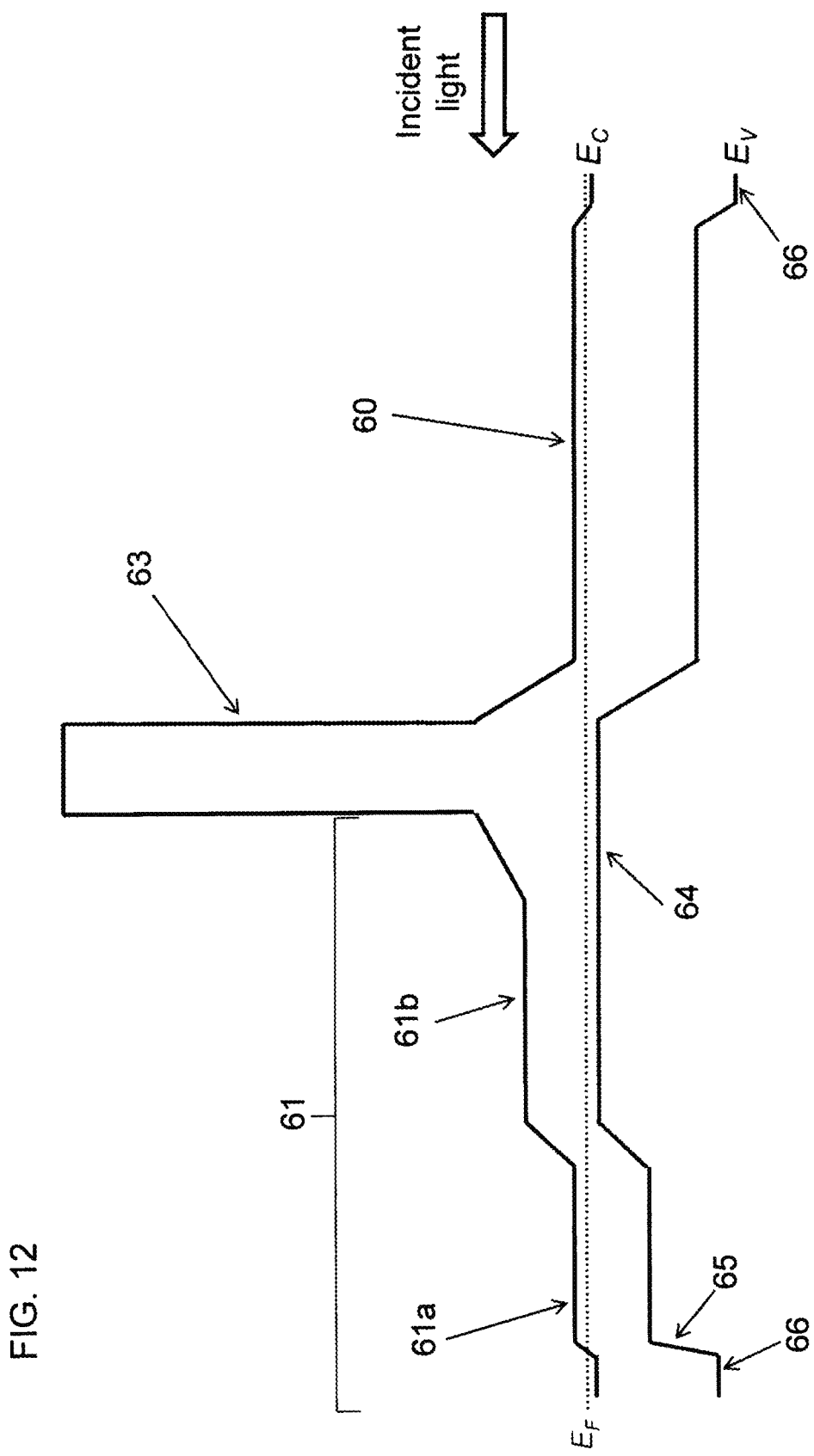
Figure 13:
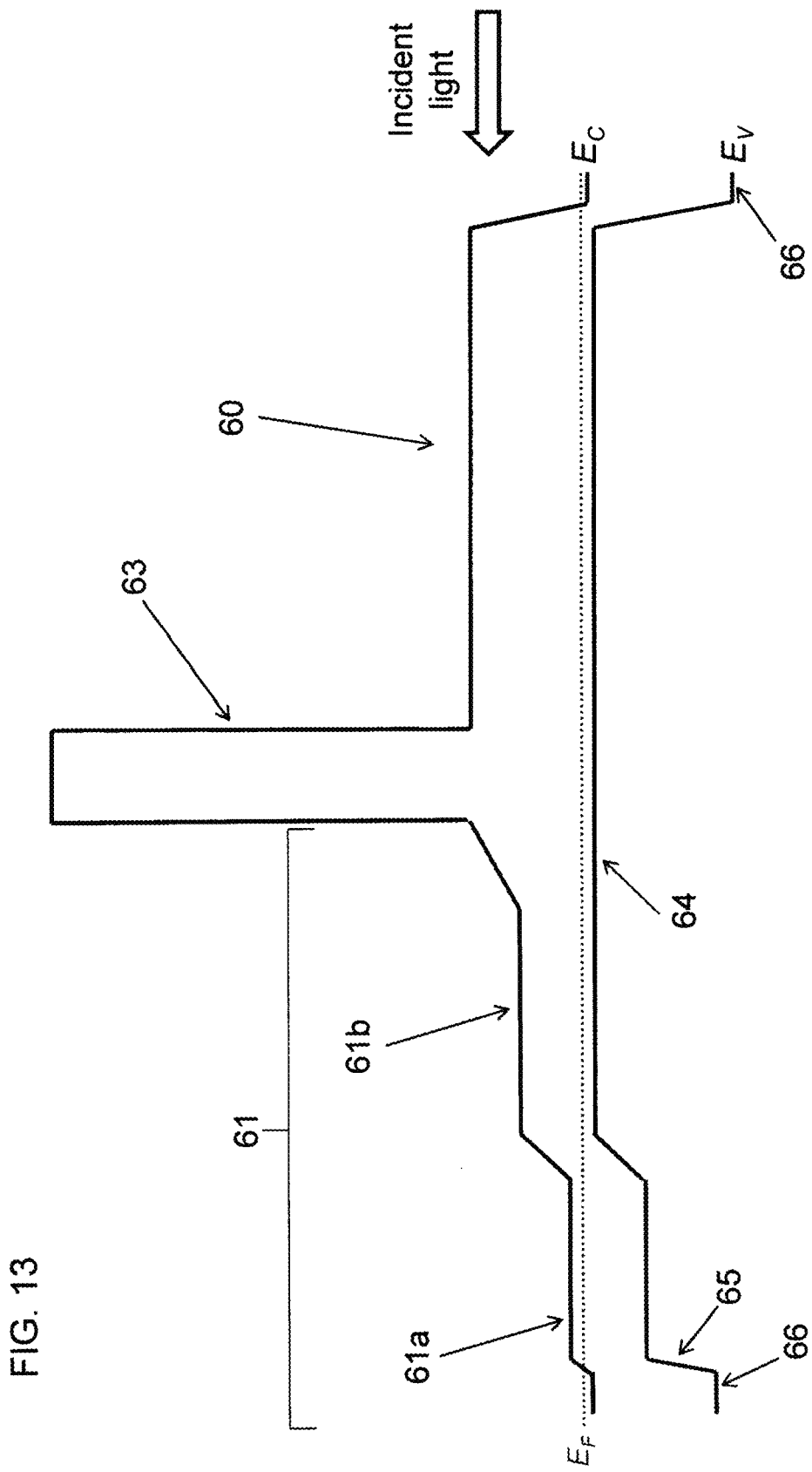
FIG. 13 provides a schematic energy band diagram of an npBP dual-band infrared detector in accordance with embodiments of the current invention.
Figure 14:
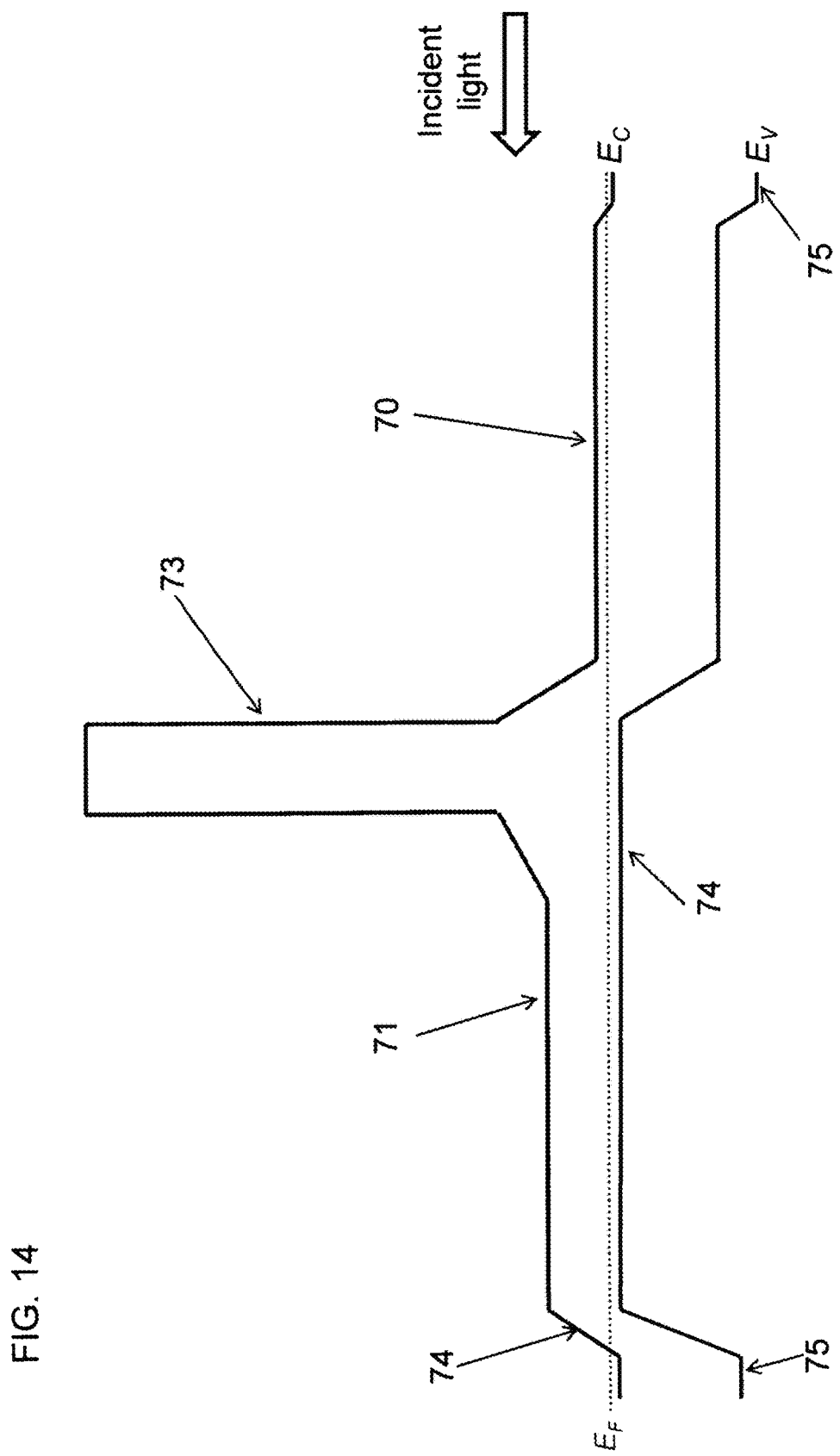
FIG. 14 provides a schematic energy band diagram of a pBN dual-band infrared detector in accordance with embodiments of the current invention.
Figure 15:
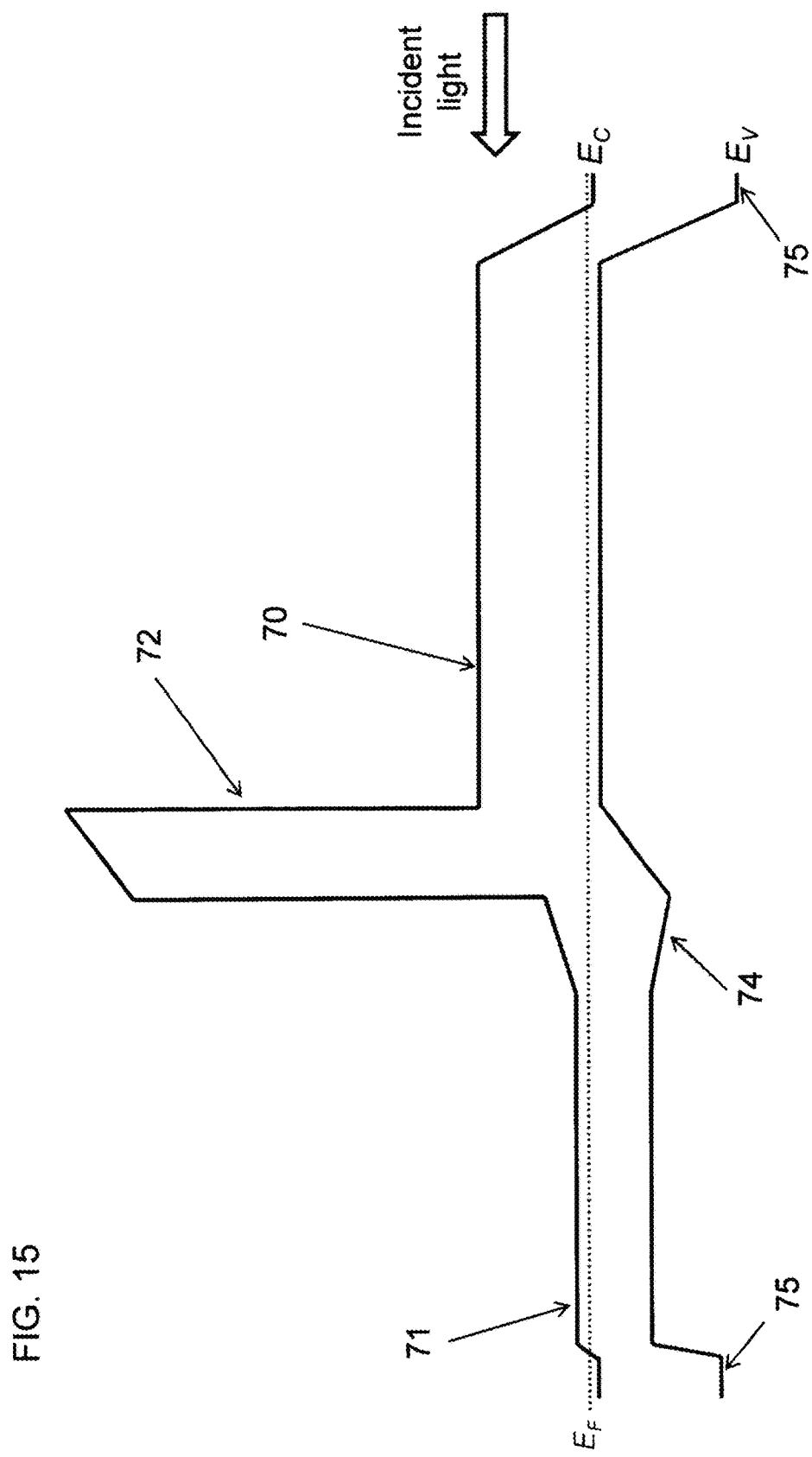
FIG. 15 provides a schematic energy band diagram of an nBP dual-band infrared detector in accordance with embodiments of the current invention.
Figure 16:
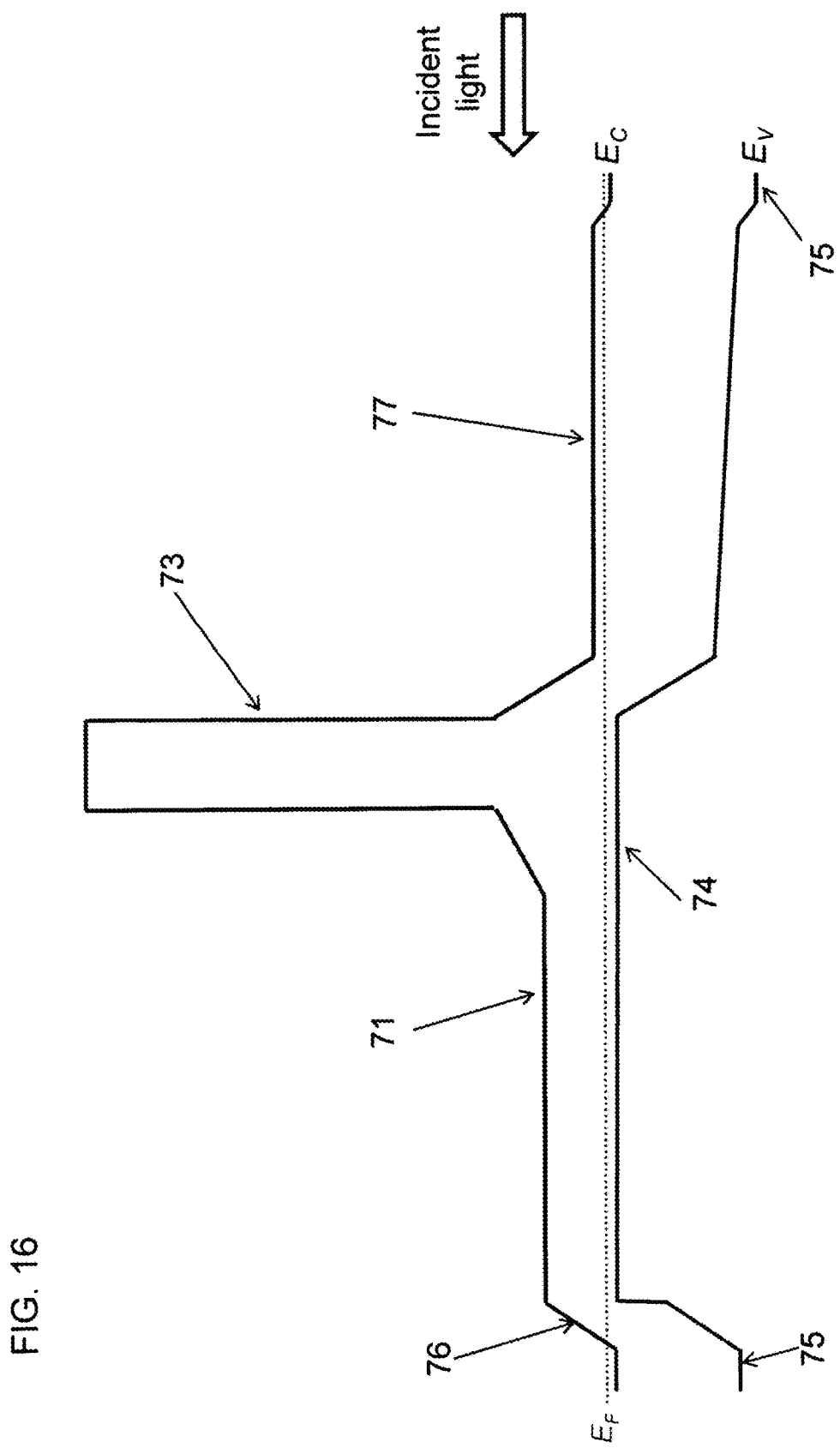
FIG. 16 provides a schematic energy band diagram of a pBN dual-band infrared detector with a hole unipolar barrier transition region in accordance with embodiments of the current invention.

Although embodiments of dual-band detectors comprising a single multi-segmented absorber are shown in FIGS. 7a and 7b, it will be understood that such multi-segmented absorber sections may be used in a wide variety of dual-band detectors, as will be described in greater detail below. These structures may be divided into four general classes:

Where both Absorb 1 (40) and Absorber 2 (41) contain both p-type (40a and 41a) and n-type sections (40b and 41b) (e.g., these structures may be designated as npBPN, where n, p, N, and P represent absorber sections (and where capital letters denote wider band gap material), and B represents the electron unipolar barrier (42). An example of embodiments of such a structure is illustrated in FIG. 8 (it should be noted that the structure sequence includes embodiments of contact (43 and 44) and transition layers (45) and (46), however these structures may take different forms or may be modified in alternative embodiments). In some embodiments the segments of the absorbers (Absorber 1 and Absorber 2) may have different band gaps (e.g., 40a and 40b may have different bandgaps). In such embodiments a graded-transition region may be included between the segments to ensure the smooth connection of the valence and conductance bands.

Where Absorber 1 (50) contains both p-type (50a) and n-type (50b) sections, but Absorber 2 (51) is of only a single doping type. The two structure sequences in this class of devices are nBPN (as illustrated in FIG. 9), and pBPN (as illustrated in FIG. 10). As shown in FIGS. 9 and 10, the multi-segmented absorbers may be utilized with graded (53) or ungraded (54) unipolar barriers, as well as with a number of graded-gap transition regions (55) positioned disposed as necessary within the dual-band detector structure to provide smooth transition between absorber and barrier layers and/or contact (56) and absorber layers. FIG. 11 illustrates a variation of the pBPN structure where the transition layer (57) between the p-type Absorber 2 (51) and the top contact layer (56) is a hole unipolar barrier.

Where Absorber 1 (60) is of a single doping type, and Absorber 2 (61) contains both n-type (61a) and p-type (61b) sections. The two structure sequences in accordance with embodiment of this third class of dual-band detectors are npBN (as illustrated in FIG. 12), and npBP (as illustrated in FIG. 13). As shown in FIGS. 12 and 13, the multi-segmented absorbers may be utilized with graded or ungraded unipolar barriers (63), as well as with a number of graded-gap transition regions (64) and (65) positioned disposed as necessary within the dual-band detector structure to provide smooth transition between absorber and barrier layers and/or contact (66) and absorber layers.

Where each of the Absorber 1 (70) and Absorber 2 (71) is of a single doping type, but Absorbers 1 and 2 have the opposite doping types. The two structure sequences in embodiments of this fourth class of dual-band detectors are pBN (as illustrated in FIG. 14), and nBP (as illustrated in FIG. 15). As shown in FIGS. 14 and 15, the multi-segmented absorbers may be utilized with graded (72) or ungraded (73) unipolar barriers, as well as with a number of graded-gap transition regions (74) positioned disposed as necessary within the dual-band detector structure to provide smooth transition between absorber and barrier layers and/or contact (75) and absorber layers. FIG. 16 illustrates a variation of the pBN structure in accordance with embodiments where the transition layer (76) between the p-type Absorber 2 (71) and the top contact layer (75) is a hole unipolar barrier, and where the n-type Absorber 1 (77) has a graded band gap.

Methods of Manufacturing Detectors

Although the above discussion has focused on detector devices formed with multi-segmented absorbers, many embodiments are also directed to methodologies of constructing detectors incorporating such structures.

Figure 17:
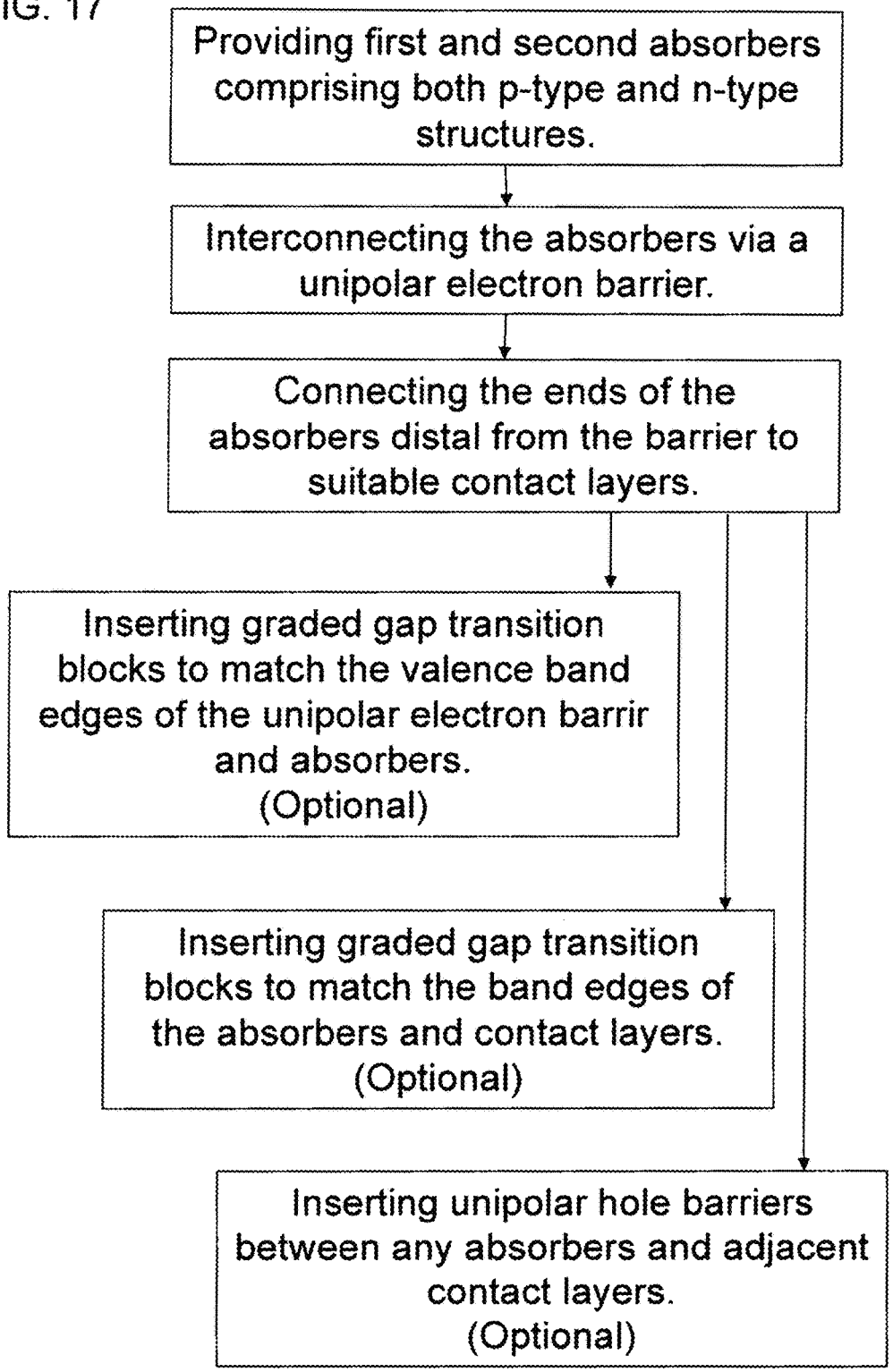
FIG. 17 provides a flow-chart of a process for forming dual-band infrared detectors in accordance with embodiments of the current invention.

FIG. 17 provides a flow chart for such methodology, which, in many embodiments include at least the following processes:
- Providing a first and second absorber where either the combined absorbers incorporate both p-type and n-type structures (e.g., where the two absorbers contain a single different type of structure, or where one or both of the absorbers are multi-segmented thus having both n and p-type materials);
- Interconnecting the absorbers via a unipolar electron barrier (graded or ungraded);
- Connecting the ends of the absorbers distal from the barrier to suitable contact layers;
- Inserting graded gap transition regions as necessary between the unipolar electron barrier and the absorbers to match the valence band edges of the segments of the detectors to allow the formation of a variety of dual band detectors across a wide-range of wavelengths;
- Inserting graded gap transition regions as necessary between the absorbers and the wider band gap contact layers to match the band edges of the segments of the detectors to allow the formation of a variety of dual band detectors across a wide-range of wavelengths; and
- Inserting unipolar hole barrier regions as necessary between the absorber and the contact layer to allow the formation of a variety of dual band detectors across a wide-range of wavelengths.

Although the above steps provide embodiments of some basic processes for forming enhanced quantum efficiency and/or reduced spectral crosstalk detectors, it should be understood that other steps may be incorporated into the process. For example, in some embodiments superlattice structures may be used in the absorber, transition or contact layers.

In embodiments, the thicknesses of the individual segments of the absorbers of the dual-band infrared detectors are configured such that they are below the diffusion length of the absorber material.

With regard to specific growth and doping techniques, it will be understood that any suitable methods may be used, such as, for example, those described in U.S. Pat. No. 8,217,480.

Making use of the existing well-matched absorber and the electron barrier, and then using graded gap transition regions to smoothly connect the valence band edge of the electron barrier block to that of the desired absorbers it is possible to construct many different detector architectures, including npBPN, nBPN, pBPN, npBN, npBP, pBN and nBP structures.

Exemplary Embodiments

In this section, several examples of dual-band barrier infrared detectors implementations using the multi-segmented absorbers described earlier are provided. In addition, the performance of several embodiments of the detector are provided. The person skilled in the art will recognize that additional embodiments according to the invention are contemplated as being within the scope of the foregoing generic disclosure, and no disclaimer is in any way intended by these non-limiting examples.

SUMMARY

In summary, a highly manufacturable dual-band infrared detector incorporating quantum efficiency enhancing and/or spectral crosstalk minimizing structures have been described. In particular, detectors formed with multi-segmented absorber sections are provided. Using these structures, examples of high-performance dual-band infrared detectors have also been described. In general, the barrier infrared detector of the current invention have the following characteristics:
- A dual-band structure where the two absorbers incorporate different types (n-type and p-type) of absorber materials (e.g., where the absorbers are each of a single-type of material but are different, or where at least one of the absorbers incorporates a multi-segmented construction incorporating both n-type and p-type materials.
- The ability to operate with unipolar barriers (electron blocking) having either graded or ungraded structures.
- The ability to operate with graded-gap-transition regions that grades from the one or both of the absorbers to the unipolar barrier layer across any number of desired cut-off wavelengths.
- The absorbers of the current invention can be used in combination with any suitable dual-band infrared detector structure, including npBPN, nBPN, pBPN, npBN, npBP, pBN and nBP.

In contrast to conventional detectors, the current dual-band infrared detectors provide excellent enhancement of quantum efficiency and/or reduction in spectral crosstalk while remaining easily manufacturable. Specifically, in the case of dual-band detector with superlattice absorbers, the nBn device architecture suffers from low quantum efficiency due to short hole diffusion length, resulting in spectral cross talk. Meanwhile, the pBp structure can support high quantum efficiency by using thicker absorber layers because of the much longer electron diffusion length, but suffers from surface leakage current. The BBCBIRD structure has high quantum efficiency and suppresses surface leakage current, but requires deep etch and a thicker bottom contact layer for etch depth tolerance (see element (17) in FIG. 5). The pBPN structure (see, FIGS. 10, and 11) in accordance with embodiments of this invention has high quantum efficiency and suppresses dark current, but has a smaller etch depth than the BBCBIRD and does not require a thick bottom contact layer. The pBN structure (see, FIGS. 14 and 16) requires an even smaller etch depth than the pBPN, and can be useful if the n-type Absorber 1 could provide sufficient quantum efficiency.

Moreover, although there is a general desire to avoid p-n junctions in infrared detectors to prevent the generation of G-R dark current, the presence of the p-n junction in the detectors in accordance with embodiments does not need to be a source of G-R dark current. In particular, it has been found that judicious junction doping profile in unipolar barrier heterojunction designs can be used to minimize the G-R dark current. (See, e.g., D. Z.-Y. Ting, et al., *Appl. Phys. Lett.* 95, 023508 (2009); D. Z.-Y. Ting, et al., *Appl. Phys. Lett.* 102, 121109 (2013), the disclosures of each of which are incorporated herein by reference.) In addition, as explained earlier, the dual-band detector may also be cooled to accommodate the narrower-gap Absorber 2, such that the G-R dark current from the Absorber 1 p-n homojunction is not problematic.

Doctrine of Equivalents

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. A detector structure comprising:
    an electron unipolar barrier having first and second sides;
    a first absorber disposed on the first side of the unipolar barrier and comprising at least a first absorber structure formed from at least a first absorber material having a first bandgap;
    a second absorber disposed on the second side of the unipolar barrier and comprising at least a second absorber structure formed from at least a second absorber material having a second bandgap and being, wherein the second bandgap is narrower than the first bandgap;
    wherein the valence band edges of the unipolar barrier and first and second absorbers are configured to minimize offset therebetween;
    wherein at least one of the first and second absorbers comprises an absorber structure formed from an n-type absorber material, and wherein at least one of the first and second absorbers comprises an absorber structure formed from a p-type absorber material; and
    wherein that thicknesses of each of the absorber structures of the first and second absorbers are less than the characteristic diffusion length of the absorber material from which the respective absorber structure is formed.

2. The detector structure of claim 1, wherein at least one of the first or second absorbers is multi-segmented comprising at least two absorber structures, wherein one of the absorber structures is formed from an n-type absorber material and one of the absorber structures is formed from a p-type absorber material.

3. The detector structure of claim 2, further comprising at least one graded-gap transition region being disposed between the absorber structures of the multi-segmented absorber and configured to minimize offset between the band edges of the individual segments of the multi-segmented absorber.

4. The detector structure of claim 1, wherein both the first and second absorbers are multi-segmented each comprising at least two absorber structures, wherein one of the absorber structures is formed from an n-type absorber material and one of the absorber structures is formed from a p-type absorber material.

5. The detector structure of claim 4, further comprising at least one graded-gap transition region being disposed between the segments of each of the multi-segmented absorbers and configured to minimize offset between the band edges of the individual segments of each of the multi-segmented absorbers.

6. The detector structure of claim 1, wherein the unipolar barrier is graded.

7. The detector structure of claim 1, wherein the unipolar barrier is ungraded and further comprising at least one graded-gap transition region being disposed between the unipolar barrier and one of either the first or second absorber, and configured to minimize offset between the valence band edges of the absorber and the unipolar barrier.

8. The detector structure of claim 1, further comprising a contact layer disposed distal to each of the absorbers; and
    further comprising at least one graded-gap transition region being disposed between at least one of the contact layers and one of either the first or second absorber, and configured to minimize offset between the band edges of the absorber and the contact layer.

9. The detector structure of claim 1, further comprising at least one graded-gap transition region being disposed within the detector structure and configured to minimize offset between the valence band edges of one or more absorbers to the barrier layer;
    wherein the graded-gap comprises a superlattice formed from a plurality of repeated layers of at least two semiconductor materials, each layer being defined by a layer thickness such that each superlattice has a period defined by the combined thicknesses of the plurality of repeated layers; and
    wherein the energy band gap structure of each superlattice including the band gap, conduction band edge and the valence band edge depends on the composition, thickness and period of the plurality of the repeated layers.

10. The detector structure of claim 1, wherein both the first and second absorbers each comprise at least one absorber structure formed of a p-type absorber material and at least one absorber structure formed of an n-type absorber material.

11. The detector structure of claim 1, wherein the first absorber comprises at least one absorber structure formed of a p-type absorber material and at least one absorber structure formed of an n-type absorber material, and wherein the second absorber comprises a single absorber structure formed of one of either an n-type or a p-type absorber material.

12. The detector structure of claim 1, wherein the second absorber comprises at least one absorber structure formed of a p-type absorber material and at least one absorber structure formed of an n-type absorber material, and wherein the first absorber comprises a single absorber structure formed of one of either an n-type or a p-type absorber material.

13. The detector structure of claim 1, wherein the first and second absorbers are each different and each comprise a single absorber structure formed of one of either an n-type or a p-type absorber material.

14. The detector structure of claim 1, wherein the n-type absorber structures are formed from a graded-gap material.

15. The detector structure of claim 1, further comprising at least one contact layer disposed on the side of each absorber distal to the unipolar barrier, and wherein the contact layers are formed of a doped n-type material and have a wider band gap material than the band gap of the adjacent absorber.

16. The detector structure of claim 15, further comprising graded-gap transition regions between either of the absorbers and the adjacent contact layer and configured to allow the free flow of electrons therebetween.

17. The detector structure of claim 1, further comprising a contact layer disposed distal to each of the absorbers; and
    further comprising a hole unipolar barrier between either of the absorbers and the adjacent contact layer.

* * * * *